US011268023B2

(12) United States Patent
Naito et al.

(10) Patent No.: US 11,268,023 B2
(45) Date of Patent: Mar. 8, 2022

(54) MIXTURE CONTAINING PEROVSKITE COMPOUND

(71) Applicant: Sumitomo Chemical Company, Limited, Tokyo (JP)

(72) Inventors: Shota Naito, Tsukuba (JP); Yoshiaki Sakatani, Niihama (JP)

(73) Assignee: Sumitomo Chemical Company, Limited, Tokyo (JP)

( * ) Notice: Subject to any disclaimer, the term of this patent is extended or adjusted under 35 U.S.C. 154(b) by 114 days.

(21) Appl. No.: 16/491,800

(22) PCT Filed: Mar. 8, 2018

(86) PCT No.: PCT/JP2018/008969
§ 371 (c)(1),
(2) Date: Sep. 6, 2019

(87) PCT Pub. No.: WO2018/168638
PCT Pub. Date: Sep. 20, 2018

(65) Prior Publication Data
US 2021/0122976 A1   Apr. 29, 2021

(30) Foreign Application Priority Data
Mar. 13, 2017   (JP) ............................. JP2017-047034

(51) Int. Cl.
C09K 11/88   (2006.01)
C09K 11/02   (2006.01)
(Continued)

(52) U.S. Cl.
CPC ............ *C09K 11/883* (2013.01); *C09K 11/02* (2013.01); *C09K 11/025* (2013.01);
(Continued)

(58) Field of Classification Search
CPC ...... C09K 11/883; C09K 11/02; C09K 11/025; C09K 11/0883; C09K 11/665;
(Continued)

(56) References Cited

U.S. PATENT DOCUMENTS 10,153,407 B2 *  12/2018  Zhang ................. H01L 33/504
2017/0018690 A1   1/2017  Werner et al.
(Continued)

FOREIGN PATENT DOCUMENTS

CN   105038408 A   11/2015
CN   105051152 A   11/2015
(Continued)

OTHER PUBLICATIONS

Palazon el al., Polymer-Free Films of Inorganic Halide Perovskite Nanocryslals as UV-to-While Color-Conversion Layers in LEDs, Chemistry of Materials 28: 2902-2906 (2016), Apr. 19, 2016. (including supplementary information).*
(Continued)

*Primary Examiner* — C Melissa Koslow
(74) *Attorney, Agent, or Firm* — Morgan, Lewis & Bockius LLP

(57) ABSTRACT

The present invention relates to a mixture of a compound (1) and a compound (2). The compound (1) is a light-emitting perovskite compound which includes components A, B, and X, and the compound (2) is a light-emitting indium compound or light-emitting cadmium compound. The component A indicates a component positioned at each vertex of a hexahedron having the component B at the center in a perovskite type crystal structure and is a monovalent cation, the component X indicates a component positioned at each vertex of an octahedron having the component B at the center in the perovskite type crystal structure and is one or more kinds of anions selected from the group consisting of
(Continued)

a halide ion and a thiocyanate ion, and the component B indicates a component positioned at the centers of the hexahedron where the component A is disposed at each vertex and the octahedron where the component X is disposed at each vertex in the perovskite type crystal structure and is a metal ion.

13 Claims, 3 Drawing Sheets

(51) Int. Cl.
  *C09K 11/08* (2006.01)
  *C09K 11/62* (2006.01)
  *C09K 11/66* (2006.01)
  *C09K 11/70* (2006.01)
  *F21V 8/00* (2006.01)

(52) U.S. Cl.
  CPC .......... *C09K 11/0883* (2013.01); *C09K 11/62* (2013.01); *C09K 11/626* (2013.01); *C09K 11/628* (2013.01); *C09K 11/665* (2013.01); *C09K 11/703* (2013.01); *G02B 6/005* (2013.01)

(58) Field of Classification Search
  CPC ..... C09K 11/703; C09K 11/62; C09K 11/626; C09K 11/628
  See application file for complete search history.

(56) References Cited

U.S. PATENT DOCUMENTS

| | | | |
|---|---|---|---|
| 2017/0186922 A1* | 6/2017 | Kim | .................... C09K 11/703 |
| 2018/0047928 A1 | 2/2018 | Kim et al. | |
| 2018/0158996 A1 | 6/2018 | Zhang et al. | |
| 2018/0230321 A1 | 8/2018 | Pan et al. | |
| 2018/0237691 A1 | 8/2018 | Pan et al. | |

FOREIGN PATENT DOCUMENTS

| | | | |
|---|---|---|---|
| CN | 105062193 A | | 11/2015 |
| CN | 105742462 | * | 7/2016 |
| CN | 106010383 A | | 10/2016 |
| CN | 106449908 A | | 2/2017 |
| JP | 2016-518468 A | | 6/2016 |
| JP | 2016-145269 A | | 8/2016 |
| WO | 2014/140936 A2 | | 9/2014 |
| WO | 2016/189869 A1 | | 12/2016 |
| WO | 2017/166871 A1 | | 10/2017 |
| WO | WO 2017/166871 | * | 10/2017 |
| WO | 2017/195062 A1 | | 11/2017 |
| WO | WO 2017/195062 | * | 11/2017 |

OTHER PUBLICATIONS

Translation for CN 105742462, Jul. 6, 2016.*
He et al., "Wide Color Gamut LCDs with Narrow Green Emitting Films," Proceedings of SPIE, 10524:10125 (2017).
Extended European Search Report issued in corresponding European Patent Application No. 18767507.9 dated Sep. 7, 2020.
International Search Report issued in corresponding International Patent Application No. PCT/JP2018/008969 dated Apr. 3, 2018.
Office Action issued in corresponding Japanese Patent Application No. 2018-569183 dated May 14, 2019.
Li et al., "CsPbX3 Quantum Dots for Lighting and Displays: Room-Temperature Synthesis, Photoluminescence Superiorities, Underlying Origins and White Light-Emitting Diodes," Advanced Functional Materials, 26: 2435-2445 (2016).
Dirin et al., "Lead Halide Perovskites and Other Metal Halide Complexes as Inorganic Capping Ligands for Colloidal Nanocrystals," Journal of the American Chemical Society, 136: 6550-6553 (2014) (including supplementary Information).
Palazon et al., "Polymer-Free Films of Inorganic Halide Perovskite Nanocrystals as UV-to-White Color-Conversion Layers in LEDs," Chemistry of Materials 28: 2902-2906 (2016) (including supplementary information).
Office Action issued in related Taiwanese Patent Application No. 107108066 dated Jun. 28, 2021.
Office Action issued in corresponding Chinese Patent Application No. 201880017418.X dated Jan. 18, 2022.

* cited by examiner

MIXTURE CONTAINING PEROVSKITE COMPOUND

TECHNICAL FIELD

The present invention relates to a mixture containing a perovskite compound.

Priority is claimed on Japanese Patent Application No. 2017-047034, filed on Mar. 13, 2017, the content of which is incorporated herein by reference.

BACKGROUND ART

An LED backlight which includes a blue LED and a composition containing two kinds of compounds with different emission wavelengths has been developed.
In recent years, there is a growing interest in a perovskite compound as a light-emitting compound contained in the composition.

For example, as a composition containing a perovskite compound, a composition which contains different kinds of perovskite compounds and is formed by laminating two layers has been reported (Non-Patent Document 1).

CITATION LIST

Patent Literature

[Non-Patent Document 1] Xiaoming Li, Ye Wu, Shengli Zhang, Bo Cai, Yu Gu, Jizhong Song, Haibo Zeng, Advanced Functional Materials, 26, p. 2435-2445 (2016)

DISCLOSURE OF INVENTION

Technical Problem

However, since a step for forming a plurality of layers is required for the composition obtained by the lamination described in Non-Patent Document 1, it cannot necessarily be said that the productivity is sufficient.

Accordingly, in a case where a mixture of two kinds of perovskite compounds with difference emission wavelengths is produced, a problem in that two kinds of unique emission peaks of the respective perovskite compounds become one peak has been found.

The present invention has been made in consideration of the above-described problems, and an object thereof is to provide a mixture containing a perovskite compound having two kinds of emission peaks and high productivity.

Solution to Problem

As the result of intensive examination conducted by the present inventors in order to solve the above-described problems, the present invention described below has been completed.

In other words, embodiments of the present invention include the following inventions [1] to [9].

[1] A mixture including: a light-emitting perovskite compound (1) which includes constituent components A, B, and X; and a light-emitting indium compound or light-emitting cadmium compound (2),
wherein the constituent component A indicates a component positioned at each vertex of a hexahedron having the constituent component B at the center in a perovskite type crystal structure and is a monovalent cation, the constituent component X indicates a component positioned at each vertex of an octahedron having the constituent component B at the center in the perovskite type crystal structure and is one or more kinds of anions selected from the group consisting of a halide ion and a thiocyanate ion, and the constituent component B indicates a component positioned at the centers of the hexahedron where the constituent component A is disposed at each vertex and the octahedron where the constituent component X is disposed at each vertex in the perovskite type crystal structure and is a metal ion.

[2] The mixture according to [1], further including: at least one of a solvent (3), and a polymerizable compound or polymer (4).

[3] The mixture according to [1] or [2], further including: at least one compound (5) selected from the group consisting of ammonia, an amine, a carboxylic acid, and salts or ions thereof.

[4] A mixture including: a light-emitting perovskite compound (1) which includes constituent components A, B, and X; a light-emitting indium compound or light-emitting cadmium compound (2); and a polymer (4'),
wherein a total content ratio of the compound (1), the compound (2), and the polymer (4') is 90% by mass or greater with respect to a total mass of the mixture,
wherein the constituent component A indicates a component positioned at each vertex of a hexahedron having the constituent component B at the center in a perovskite type crystal structure and is a monovalent cation, the constituent component X indicates a component positioned at each vertex of an octahedron having the constituent component B at the center in the perovskite type crystal structure and is one or more kinds of anions selected from the group consisting of a halide ion and a thiocyanate ion, and the constituent component B indicates a component positioned at the centers of the hexahedron where the constituent component A is disposed at each vertex and the octahedron where the constituent component X is disposed at each vertex in the perovskite type crystal structure and is a metal ion.

[5] The mixture according to [4], further including: at least one compound (5) selected from the group consisting of ammonia, an amine, a carboxylic acid, and salts or ions thereof.

[6] A film which is formed of the mixture according to [4] or [5].

[7] A laminated structure including: the film according to [6].

[8] A light-emitting device including: the laminated structure according to [7].

[9] A display including: the laminated structure according to [7].

Advantageous Effects of Invention

According to the present invention, it is possible to provide a mixture containing a perovskite compound having two kinds of emission peaks and high productivity.

BEST MODE FOR CARRYING OUT THE INVENTION

Figure 1:
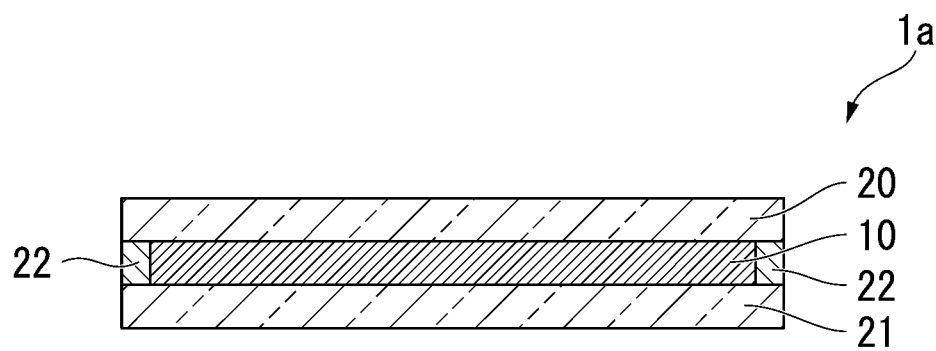
FIG. 1 is a cross-sectional view showing an embodiment of a laminated structure according to the present invention.

Hereinafter, the present invention will be described in detail based on embodiments.

<Mixture>

A mixture according to the present embodiment has a light-emitting property. The "light-emitting property" indicates a property of emitting light. As the light-emitting property, a property of emitting light using excitation of electrons is preferable, and a property of emitting light using excitation of electrons caused by excitation light is more preferable. The wavelength of excitation light may be, for example, in a range of 200 nm to 800 nm, in a range of 250 nm to 750 nm, or in a range of 300 nm to 700 nm.

The mixture according to the present embodiment contains a compound (1) and a compound (2).

The compound (1) is a light-emitting perovskite compound which includes constituent components A, B, and X.

(The constituent component A indicates a component positioned at each vertex of a hexahedron having the constituent component B at the center in a perovskite type crystal structure and is a monovalent cation, the constituent component X indicates a component positioned at each vertex of an octahedron having the constituent component B at the center in the perovskite type crystal structure and is one or more kinds of anions selected from the group consisting of a halide ion and a thiocyanate ion, and the constituent component B indicates a component positioned at the centers of the hexahedron where the constituent component A is disposed at each vertex and the octahedron where the constituent component X is disposed at each vertex in the perovskite type crystal structure and is a metal ion.)

The compound (2) is a light-emitting indium compound or light-emitting cadmium compound.

Hereinafter, the "perovskite compound (1) including the constituent components A, B, and X" will also be referred to as a "perovskite compound (1)".

The mixture of the present embodiment may be a composition obtained by mixing the compound (1) and the compound (2) or may contain components other than the compound (1) and the compound (2).

For example, the mixture of the present embodiment may further include at least one of a solvent (3) and a polymerizable compound or polymer (4). In the embodiment of the mixture containing at least one of the solvent (3) and the polymerizable compound or polymer (4), the compound (1) and the compound (2) may be dispersed in at least one of the solvent (3) and the polymerizable compound or polymer (4).

The mixture according to the present embodiment may further include at least one compound (5) selected from the group consisting of ammonia, an amine, and a carboxylic acid, and salts or ions thereof.

In a case where the mixture according to the present embodiment further includes the compound (5), for example, a form in which at least a part of the compound (1) is coated with the compound (5) may be employed. Hereinafter, the compound (1) having at least a part coated with the compound (5) is also referred to as a "perovskite compound (1) containing at least one compound (5) selected from the group consisting of ammonia, an amine, and a carboxylic acid, and salts or ions thereof".

The mixture according to the present embodiment may further include components other than the above-described components (1) to (5).

Examples of other components include a small amount of impurities and a compound having an amorphous structure formed of an element component constituting the compound (1) or (2), a polymerization initiator, and an inorganic compound for forming a protective layer of the compound (2).

The content ratio of other components is preferably 10% by mass or less, more preferably 5% by mass or less, and still more preferably 1% by mass or less with respect to the total mass of the mixture.

As the result of intensive examination conducted by the present inventors, it was found that the mixture containing a light-emitting perovskite compound (1) which includes constituent components A, B, and X (the constituent component A indicates a component positioned at each vertex of a hexahedron having the constituent component B at the center in a perovskite type crystal structure and is a monovalent cation, the constituent component X indicates a component positioned at each vertex of an octahedron having the constituent component B at the center in the perovskite type crystal structure and is one or more kinds of anions selected from the group consisting of a halide ion and a thiocyanate ion, and the constituent component B indicates a component positioned at the centers of the hexahedron where the constituent component A is disposed at each vertex and the octahedron where the constituent component X is disposed at each vertex in the perovskite type crystal structure and is a metal ion), and a light-emitting indium compound or light-emitting cadmium compound (2) independently has peaks of two emission wavelengths as they are, which are derived from the compound (1) and the compound (2).

In the mixture according to the embodiment which contains the compound (1), the compound (2), and at least one of the solvent (3), and the polymerizable compound or polymer (4), the content ratio of the compound (1) with respect to the total mass of the mixture is not particularly limited. However, from the viewpoints of making the compound (1) difficult to be condensed and preventing the concentration quenching, the content ratio thereof is preferably 50% by mass or less, more preferably 2% by mass or less, and still more preferably 1% by mass or less. Further, from the viewpoint of obtaining excellent emission intensity, the content ratio thereof is preferably 0.0001% by mass or greater, more preferably 0.0005% by mass or greater, and still more preferably 0.001% by mass or greater.

The above-described upper limit and lower limit can be optionally combined. The content ratio of the compound (1) with respect to the total mass of the mixture is typically in a range of 0.0001% to 50% by mass.

The content ratio of the compound (1) with respect to the total mass of the mixture is preferably in a range of 0.0001% to 2% by mass, more preferably in a range of 0.0005% to 1% by mass, and still more preferably in a range of 0.001% to 1% by mass.

From the viewpoints of making the compound (1) difficult to aggregate and exhibiting an excellent light-emitting property, it is preferable that the content ratio related to the formulation of the compound (1) in the mixture is in the above-described range.

In the mixture according to the embodiment which contains the compound (1), the compound (2), and at least one of the solvent (3), and the polymerizable compound or polymer (4), the content ratio of the compound (2) with respect to the total mass of the mixture is not particularly limited. However, from the viewpoints of making the compound (2) difficult to aggregate and preventing the concentration quenching, the content ratio thereof is preferably 50% by mass or less, more preferably 5% by mass or less, and still more preferably 3% by mass or less. Further, from the viewpoint of obtaining excellent emission intensity, the content ratio thereof is preferably 0.0001% by mass or greater, more preferably 0.0005% by mass or greater, and still more preferably 0.001% by mass or greater.

The above-described upper limit and lower limit can be optionally combined.

The content ratio of the compound (2) with respect to the total mass of the mixture is typically in a range of 0.0001% to 50% by mass.

The content ratio of the compound (2) with respect to the total mass of the mixture is preferably in a range of 0.0001% to 1% by mass, more preferably in a range of 0.0005% to 5% by mass, and still more preferably in a range of 0.001% to 0.3% by mass. From the viewpoints of making the compound (2) difficult to aggregate and exhibiting an excellent light-emitting property, it is preferable that the content ratio related to the formulation of the compound (2) in the mixture is in the above-described range.

In the mixture according to the embodiment which contains the compound (1), the compound (2), and at least one of the solvent (3), and the polymerizable compound or polymer (4), the total content ratio of the compound (1) and the compound (2) with respect to the total mass of the mixture is not particularly limited. However, from the viewpoints of making the compound (1) and the compound (2) difficult to be condensed and preventing the concentration quenching, the content ratio thereof is preferably 95% by mass or less, more preferably 10% by mass or less, and still more preferably 5% by mass or less. Further, from the viewpoint of obtaining excellent emission intensity, the content ratio thereof is preferably 0.0005% by mass or greater, more preferably 0.001% by mass or greater, and still more preferably 0.005% by mass or greater.

The above-described upper limit and lower limit can be optionally combined.

The total content ratio of the compound (1) and the compound (2) with respect to the total mass of the mixture is preferably in a range of 0.0005% to 95% by mass, more preferably in a range of 0.005% to 10% by mass, and still more preferably in a range of 0.001% to 5% by mass.

From the viewpoint of exhibiting an excellent light-emitting property, it is preferable that the content ratio related to the formulation of the compound (1) and the compound (2) in the mixture is in the above-described range.

The above-described upper limit and lower limit can be optionally combined. Further, in the mixture according to the embodiment which contains the compound (1), the compound (2), and at least one of the solvent (3), and the polymerizable compound or polymer (4), the total content ratio of the compound (1), the compound (2), and at least one of the solvent (3), and the polymerizable compound or polymer (4) may be 90% by mass or greater, 95% by mass or greater, 99% by mass or greater, or 100% by mass or greater with respect to the total mass of the mixture.

In the mixture according to the embodiment which contains the compound (1), the compound (2), the compound (5), and at least one of the solvent (3), and the polymerizable compound or polymer (4), the content ratio of the compound (1) with respect to the total mass of the mixture is not particularly limited. However, from the viewpoints of making the compound (1) difficult to be condensed and preventing the concentration quenching, the content ratio thereof is preferably 50% by mass or less, more preferably 2% by mass or less, and still more preferably 1% by mass or less.

Further, from the viewpoint of obtaining excellent emission intensity, the content ratio thereof is preferably 0.0001% by mass or greater, more preferably 0.0005% by mass or greater, and still more preferably 0.001% by mass or greater.

The above-described upper limit and lower limit can be optionally combined. The content ratio of the compound (1) with respect to the total mass of the mixture is typically in a range of 0.0001% to 50% by mass.

The content ratio of the compound (1) with respect to the total mass of the mixture is preferably in a range of 0.0001% to 2% by mass, more preferably in a range of 0.0005% to 1% by mass, and still more preferably in a range of 0.001% to 1% by mass.

From the viewpoints of making the compound (1) difficult to aggregate and exhibiting an excellent light-emitting property, it is preferable that the content ratio related to the formulation of the compound (1) in the mixture is in the above-described range.

In the mixture according to the embodiment which contains the compound (1), the compound (2), the compound (5), and at least one of the solvent (3), and the polymerizable compound or polymer (4), the content ratio of the compound (2) with respect to the total mass of the mixture is not particularly limited. However, from the viewpoints of making the compound (2) difficult to aggregate and preventing the concentration quenching, the content ratio thereof is preferably 50% by mass or less, more preferably 5% by mass or less, and still more preferably 3% by mass or less. Further, from the viewpoint of obtaining excellent emission intensity, the content ratio thereof is preferably 0.0001% by mass or greater, more preferably 0.0005% by mass or greater, and still more preferably 0.001% by mass or greater.

The above-described upper limit and lower limit can be optionally combined. The content ratio of the compound (2) with respect to the total mass of the mixture is typically in a range of 0.0001% to 50% by mass.

The content ratio of the compound (2) with respect to the total mass of the mixture is preferably in a range of 0.0001% to 1% by mass, more preferably in a range of 0.0005% to 5% by mass, and still more preferably in a range of 0.001% to 0.3% by mass.

From the viewpoints of making the compound (2) difficult to aggregate and exhibiting an excellent light-emitting property, it is preferable that the content ratio related to the formulation of the compound (2) in the mixture is in the above-described range.

In the mixture according to the embodiment which contains the compound (1), the compound (2), the compound (5), and at least one of the solvent (3), and the polymerizable compound or polymer (4), the total content ratio of the compound (1) and the compound (2) with respect to the total mass of the mixture is not particularly limited. However, from the viewpoints of making the compound (1) and the compound (2) difficult to be condensed and preventing the concentration quenching, the content ratio thereof is preferably 95% by mass or less, more preferably 10% by mass or less, and still more preferably 5% by mass or less. Further, from the viewpoint of obtaining excellent emission intensity, the content ratio thereof is preferably 0.0005% by mass or greater, more preferably 0.001% by mass or greater, and still more preferably 0.005% by mass or greater.

The above-described upper limit and lower limit can be optionally combined. The total content ratio of the compound (1) and the compound (2) with respect to the total mass of the mixture is preferably in a range of 0.0005% to 95% by mass, more preferably in a range of 0.005% to 10% by mass, and still more preferably in a range of 0.001% to 5% by mass.

From the viewpoint of exhibiting an excellent light-emitting property, it is preferable that the content ratio related to the formulation of the compound (1) and the compound (2) in the mixture is in the above-described range.

The above-described upper limit and lower limit can be optionally combined.

Further, in the mixture according to the embodiment which contains the compound (1), the compound (2), the compound (5), and at least one of the solvent (3), and the polymerizable compound or polymer (4), the total content ratio of the compound (1), the compound (2), and at least one of the solvent (3), and the polymerizable compound or polymer (4) may be 90% by mass or greater, 95% by mass or greater, 99% by mass or greater, or 100% by mass or greater with respect to the total mass of the mixture.

The embodiment of the present invention relates to a mixture containing the compound (1), the compound (2), and a polymer (4'). The mixture may be a mixture in which the total content ratio of the compound (1), the compound (2), and the polymer (4') is 90% by mass or greater with respect to the total mass of the mixture.

In the embodiment containing the compound (1), the compound (2), and the polymer (4'), the compound (1) and the compound (2) may be dispersed in the polymer (4').

The polymer (4') is a polymer.

In the mixture according to the embodiment which contains the compound (1), the compound (2), and the polymer (4'), the content ratio of the compound (1) with respect to the total mass of the mixture is not particularly limited. However, from the viewpoints of making the compound (1) difficult to aggregate and preventing the concentration quenching, the content ratio thereof is preferably 50% by mass or less, more preferably 2% by mass or less, and still more preferably 1% by mass or less. Further, from the viewpoint of obtaining excellent emission intensity, the content ratio thereof is preferably 0.0001% by mass or greater, more preferably 0.0005% by mass or greater, and still more preferably 0.001% by mass or greater.

The above-described upper limit and lower limit can be optionally combined.

The content ratio of the compound (1) with respect to the total mass of the mixture is typically in a range of 0.0001% to 50% by mass.

The content ratio of the compound (1) with respect to the total mass of the mixture is preferably in a range of 0.0001% to 2% by mass, more preferably in a range of 0.0005% to 1% by mass, and still more preferably in a range of 0.001% to 1% by mass.

From the viewpoint of exhibiting an excellent light-emitting property, it is preferable that the content ratio related to the formulation of the compound (1) in the mixture is in the above-described range.

In the mixture according to the embodiment which contains the compound (1), the compound (2), and the polymer (4'), the content ratio of the compound (2) with respect to the total mass of the mixture is not particularly limited. However, from the viewpoints of making the compound (2) difficult to be condensed and preventing the concentration quenching, the content ratio thereof is preferably 50% by mass or less, more preferably 5% by mass or less, and still more preferably 3% by mass or less. Further, from the viewpoint of obtaining excellent emission intensity, the content ratio thereof is preferably 0.0001% by mass or greater, more preferably 0.0005% by mass or greater, and still more preferably 0.001% by mass or greater.

The above-described upper limit and lower limit can be optionally combined.

The content ratio of the compound (2) with respect to the total mass of the mixture is typically in a range of 0.0001% to 50% by mass.

The content ratio of the compound (2) with respect to the total mass of the mixture is preferably in a range of 0.0001% to 5% by mass, more preferably in a range of 0.0005% to 1% by mass, and still more preferably in a range of 0.001% to 3% by mass.

From the viewpoint of exhibiting an excellent light-emitting property, it is preferable that the content ratio related to the formulation of the compound (2) in the mixture is in the above-described range.

In the mixture according to the embodiment which contains the compound (1), the compound (2), and the polymer (4'), the total content ratio of the compound (1) and the compound (2) with respect to the total mass of the mixture is not particularly limited. However, from the viewpoints of making the compound (1) and the compound (2) difficult to be condensed and preventing the concentration quenching, the content ratio thereof is preferably 95% by mass or less, more preferably 10% by mass or less, and still more preferably 5% by mass or less. Further, from the viewpoint of obtaining excellent emission intensity, the content ratio thereof is preferably 0.0005% by mass or greater, more preferably 0.001% by mass or greater, and still more preferably 0.005% by mass or greater.

The above-described upper limit and lower limit can be optionally combined.

The total content ratio of the compound (1) and the compound (2) with respect to the total mass of the mixture is preferably in a range of 0.0005% to 95% by mass, more preferably in a range of 0.005% to 10% by mass, and still more preferably in a range of 0.001% to 5% by mass.

From the viewpoint of exhibiting an excellent light-emitting property, it is preferable that the content ratio related to the formulation of the compound (1) and the compound (2) in the mixture is in the above-described range.

The embodiment of the present invention relates to a mixture containing the compound (1), the compound (2), the compound (5), and the polymer (4'). The mixture may be a mixture in which the total content ratio of the compound (1), the compound (2), the compound (5), and the polymer (4') is 90% by mass or greater with respect to the total mass of the mixture.

In the embodiment containing the compound (1), the compound (2), the compound (5), and the polymer (4'), the compound (1), the compound (2), and the compound (5) may be dispersed in the polymer (4').

The polymer (4') is a polymer.

In the mixture according to the embodiment which contains the compound (1), the compound (2), the compound (5), and the polymer (4'), the content ratio of the compound (1) with respect to the total mass of the mixture is not particularly limited. However, from the viewpoints of making the compound (1) difficult to aggregate and preventing the concentration quenching, the content ratio thereof is preferably 50% by mass or less, more preferably 2% by mass or less, and still more preferably 1% by mass or less. Further, from the viewpoint of obtaining excellent emission intensity, the content ratio thereof is preferably 0.0001% by mass or greater, more preferably 0.0005% by mass or greater, and still more preferably 0.001% by mass or greater.

The above-described upper limit and lower limit can be optionally combined.

The content ratio of the compound (1) with respect to the total mass of the mixture is typically in a range of 0.0001% to 50% by mass.

The content ratio of the compound (1) with respect to the total mass of the mixture is preferably in a range of 0.0001% to 2% by mass, more preferably in a range of 0.0005% to 1% by mass, and still more preferably in a range of 0.001% to 1% by mass.

From the viewpoint of exhibiting an excellent light-emitting property, it is preferable that the content ratio related to the formulation of the compound (1) in the mixture is in the above-described range.

In the mixture according to the embodiment which contains the compound (1), the compound (2), the compound (5), and the polymer (4'), the content ratio of the compound (2) with respect to the total mass of the mixture is not particularly limited. However, from the viewpoints of making the compound (2) difficult to be condensed and preventing the concentration quenching, the content ratio thereof is preferably 50% by mass or less, more preferably 5% by mass or less, and still more preferably 3% by mass or less. Further, from the viewpoint of obtaining excellent emission intensity, the content ratio thereof is preferably 0.0001% by mass or greater, more preferably 0.0005% by mass or greater, and still more preferably 0.001% by mass or greater.

The above-described upper limit and lower limit can be optionally combined.

The content ratio of the compound (2) with respect to the total mass of the mixture is typically in a range of 0.0001% to 50% by mass.

The content ratio of the compound (2) with respect to the total mass of the mixture is preferably in a range of 0.0001% to 5% by mass, more preferably in a range of 0.0005% to 1% by mass, and still more preferably in a range of 0.001% to 3% by mass.

From the viewpoint of exhibiting an excellent light-emitting property, it is preferable that the content ratio related to the formulation of the compound (2) in the mixture is in the above-described range.

In the mixture according to the embodiment which contains the compound (1), the compound (2), the compound (5), and the polymer (4'), the total content ratio of the compound (1) and the compound (2) with respect to the total mass of the mixture is not particularly limited. However, from the viewpoints of making the compound (1) and the compound (2) difficult to be condensed and preventing the concentration quenching, the content ratio thereof is preferably 95% by mass or less, more preferably 10% by mass or less, and still more preferably 5% by mass or less. Further, from the viewpoint of obtaining excellent emission intensity, the content ratio thereof is preferably 0.0005% by mass or greater, more preferably 0.001% by mass or greater, and still more preferably 0.005% by mass or greater.

The above-described upper limit and lower limit can be optionally combined.

The total content ratio of the compound (1) and the compound (2) with respect to the total mass of the mixture is preferably in a range of 0.0005% to 95% by mass, more preferably in a range of 0.005% to 10% by mass, and still more preferably in a range of 0.001% to 5% by mass.

From the viewpoint of exhibiting an excellent light-emitting property, it is preferable that the content ratio related to the formulation of the compound (1) and the compound (2) in the mixture is in the above-described range.

Hereinafter, the compounds and the like contained in the mixture according to the present embodiment will be described.

Light-Emitting Perovskite Compound (1)

The perovskite compound is a compound which includes constituent components A, B, and X and has a perovskite type crystal structure.

The constituent component A indicates a component positioned at each vertex of a hexahedron having the constituent component B at the center in a perovskite type crystal structure and is a monovalent cation.

The constituent component X indicates a component positioned at each vertex of an octahedron having the constituent component B at the center in the perovskite type crystal structure and is one or more kinds of anions selected from the group consisting of a halide ion and a thiocyanate ion.

The constituent component B indicates a component positioned at the centers of the hexahedron where the constituent component A is disposed at each vertex and the octahedron where the constituent component X is disposed at each vertex in the perovskite type crystal structure and is a metal ion.

The perovskite compound having the constituent components A, B, and X is not particularly limited and may be a compound having any of a three-dimensional structure, a two-dimensional structure, and a quasi-two-dimensional structure.

In a case of the three-dimensional structure, the composition of the perovskite compound is represented by $ABX_{(3+\delta)}$.

In a case of the two-dimensional structure, the composition of the perovskite compound is represented by $A_2BX_{(4+\delta)}$.

The parameter $\delta$ is a number which can be appropriately changed according to the charge balance of B and is in a range of −0.7 to 0.7.

For example, in a case where A represents a monovalent cation, B represents a divalent cation, and X represents a monovalent cation, the parameter $\delta$ can be selected such that the compound becomes electrically neutral (in other words, the charge of the compound is 0).

In the case of the three-dimensional structure, the structure has a three-dimensional network of a vertex-sharing octahedron which has B as the center and X as a vertex and is represented by $BX_6$.

In the case of the two-dimensional structure, a structure in which a layer formed of two-dimensionally connected $BX_6$ and a layer formed of A are alternately laminated is formed in a case where the octahedron which has B as the center and X as a vertex and is represented by $BX_6$ shares Xs of four vertexes in the same plane.

B represents a metal cation which can have octahedral coordination of X.

In the present specification, the perovskite type crystal structure can be confirmed by an X-ray diffraction pattern.

In a case of the compound having the perovskite type crystal structure of the three-dimensional structure, typically, a peak derived from (hkl)=(001) is confirmed at a position where $2\theta$ is in a range of 12° to 18° or a peak derived from (hkl)=(110) is confirmed at a position where $2\theta$ is in a range of 18° to 25° in the X ray diffraction pattern. It is more preferable that a peak derived from (hkl)=(001) is confirmed at a position where $2\theta$ is in a range of 13° to 16° or a peak derived from (hkl)=(110) is confirmed at a position where 2θ is in a range of 20° to 23°.

In a case of the compound having the perovskite type crystal structure of the two-dimensional structure, typically, it is more preferable that a peak derived from (hkl)=(002) is confirmed at a position where 2θ is in a range of 1° to 10° or a peak derived from (hkl)=(002) is confirmed at a position where 2θ is in a range of 2° to 8° in the X ray diffraction pattern.

As the perovskite compound, a perovskite compound represented by Formula (1) is preferable.

$$ABX_{(3+\delta)}(-0.7 \leq \delta \leq 0.7) \tag{1}$$

(The constituent component A indicates a component positioned at each vertex of a hexahedron having the constituent component B at the center in a perovskite type crystal structure and is a monovalent cation.

The constituent component X indicates a component positioned at each vertex of an octahedron having the constituent component B at the center in the perovskite type crystal structure and is one or more kinds of anions selected from the group consisting of halide ions and thiocyanate ions.

The constituent component B indicates a component positioned at the centers of the hexahedron where the constituent component A is disposed at each vertex and the octahedron where the constituent component X is disposed at each vertex in the perovskite type crystal structure and is a metal ion.)

[A]

The constituent component A indicates a component positioned at each vertex of a hexahedron having the constituent component B at the center in a perovskite type crystal structure and is a monovalent cation.

Examples of the monovalent cation include a cesium ion, an organic ammonium ion, and an amidinium ion. In a case where the constituent component A is a cesium ion, an organic ammonium ion having 3 or less carbon atoms, or an amidinium ion having 3 or less carbon atoms in the perovskite compound, the perovskite compound typically has a three-dimensional structure represented by $ABX_{(3+\delta)}$.

In the compound, a cesium ion or an organic ammonium ion is preferable as the constituent component A.

Specific examples of the organic ammonium ion as the constituent component A include a cation represented by Formula (A3).

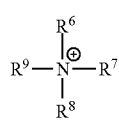
(A3)

In Formula (A3), $R^6$ to $R^9$ each independently represent a hydrogen atom, an alkyl group which may contain an amino group as a substituent, or a cycloalkyl group which may contain an amino group as a substituent. Here, none of $R^6$ to $R^9$ simultaneously represent a hydrogen atom.

The alkyl group represented by each of independent $R^6$ to $R^9$ may be linear or branched and may have an amino group as a substituent.

In a case where $R^6$ to $R^9$ represent an alkyl group, the number of carbon atoms of each of independent $R^6$ to $R^9$ is typically in a range of 1 to 20, preferably in a range of 1 to 4, still more preferably in a range of 1 to 3, and even still more preferably 1.

The cycloalkyl group represented by each of independent $R^6$ to $R^9$ may contain an alkyl group or an amino group as a substituent.

The number of carbon atoms of the cycloalkyl group represented by each of independent $R^6$ to $R^9$ is typically in a range of 3 to 30, preferably in a range of 3 to 11, and more preferably in a range of 3 to 8. The number of carbon atoms include the number of carbon atoms in a substituent.

As the group represented by each of independent $R^6$ to $R^9$, a hydrogen atom or an alkyl group is preferable.

A compound having a perovskite type crystal structure of a three-dimensional structure with high emission intensity can be obtained by decreasing the number of alkyl groups and cycloalkyl groups which can be included in Formula (A3) and decreasing the number of carbon atoms in the alkyl group and the cycloalkyl group.

In a case where the number of carbon atoms in the alkyl group or the cycloalkyl group is 4 or more, a compound partially or entirely having a two-dimensional and/or quasi-two-dimensional (quasi-2D) perovskite type crystal structure can be obtained. In a case where a two-dimensional perovskite type crystal structure is laminated at infinity, the structure becomes the same as the three-dimensional perovskite type crystal structure (reference literature: for example, P. P. Boix et al., J. Phys. Chem. Lett. 2015, 6, 898 to 907).

It is preferable that the total number of carbon atoms in the alkyl group and the cycloalkyl group represented by $R^6$ to $R^9$ is in a range of 1 to 4 and more preferable that one of $R^6$ to $R^9$ represents an alkyl group having 1 to 3 carbon atoms and three of $R^6$ to $R^9$ represent a hydrogen atom.

Examples of the alkyl group as $R^6$ to $R^9$ include a methyl group, an ethyl group, an n-propyl group, an isopropyl group, an n-butyl group, an isobutyl group, a sec-butyl group, a tert-butyl group, an n-pentyl group, an isopentyl group, a neopentyl group, a tert-pentyl group, a 1-methylbutyl group, an n-hexyl group, a 2-methylpentyl group, a 3-methylpentyl group, a 2,2-dimethylbutyl group, a 2,3-dimethylbutyl group, an n-heptyl group, a 2-methylhexyl group, a 3-methylhexyl group, a 2,2-dimethylpentyl group, a 2,3-dimethylpentyl group, a 2,4-dimethylpentyl group, a 3,3-dimethylpentyl group, a 3-ethylpentyl group, a 2,2,3-trimethylbutyl group, an n-octyl group, an isooctyl group, a 2-ethylhexyl group, a nonyl group, a decyl group, an undecyl group, a dodecyl group, a tridecyl group, a tetradecyl group, a pentadecyl group, a hexadecyl group, a heptadecyl group, an octadecyl group, a nonadecyl group, and an icosyl group.

As the cycloalkyl group as $R^6$ to $R^9$, a group in which an alkyl group having 3 or more carbon atoms which has been provided as an exemplary example of the alkyl group represented by each of independent $R^6$ to $R^9$ forms a ring is an exemplary example, and examples thereof include a cyclopropyl group, a cyclobutyl group, a cyclopentyl group, a cyclohexyl group, a cycloheptyl group, a cyclooctyl group, a cyclononyl group, a cyclodecyl group, a norbornyl group, an isobornyl group, a 1-adamantyl group, a 2-adamantyl group, and a tricyclodecyl group.

As the organic ammonium ion represented by A, $CH_3NH_3^+$ (also referred to as a methylammonium ion), $C_2H_5NH_3^+$ (also referred to as an ethylammonium ion), or $C_3H_7NH_3^+$ (also referred to as a propylammonium ion) is preferable, $CH_3NH_3^+$ or $C_2H_5NH_3^+$ is more preferable, $CH_3NH_3^+$ is still more preferable.

As the amidinium ion represented by A, an amidinium ion represented by Formula (A4) is an exemplary example.

$$(R^{10}R^{11}N=CH-NR^{12}R^{13})^+ \tag{A4}$$

In Formula (A4), $R^{10}$ to $R^{13}$ each independently represent a hydrogen atom, an alkyl group which may contain an amino group as a substituent, or a cycloalkyl group which may contain an amino group as a substituent.

The alkyl group represented by each of independent $R^{10}$ to $R^{13}$ may be linear or branched and may have an amino group as a substituent.

The number of carbon atoms in the alkyl group represented by each of independent $R^{10}$ to $R^{13}$ is typically in a range of 1 to 20, preferably in a range of 1 to 4, and still more preferably in a range of 1 to 3.

The cycloalkyl group represented by each of independent $R^{10}$ to $R^{13}$ may contain an alkyl group or an amino group as a substituent.

The number of carbon atoms of the cycloalkyl group represented by each of independent $R^{10}$ to $R^{13}$ is typically in a range of 3 to 30, preferably in a range of 3 to 11, and more preferably in a range of 3 to 8.

The number of carbon atoms include the number of carbon atoms in a substituent.

Specific examples of the alkyl group as $R^{10}$ to $R^{13}$ are the same as those provided as exemplary examples of the alkyl group represented by each of independent $R^6$ to $R^9$.

Specific examples of the cycloalkyl group as $R^{10}$ to $R^{13}$ are the same as those provided as exemplary examples of the cycloalkyl group represented by each of independent $R^6$ to $R^9$.

As the group represented by each of independent $R^{10}$ to $R^{13}$, a hydrogen atom or an alkyl group is preferable.

A perovskite compound having a three-dimensional structure with high emission intensity can be obtained by decreasing the number of alkyl groups and cycloalkyl groups which can be included in Formula (A4) and decreasing the number of carbon atoms in the alkyl group and the cycloalkyl group.

In a case where the number of carbon atoms in the alkyl group or the cycloalkyl group is 4 or more, a compound partially or entirely having a two-dimensional and/or quasi-two-dimensional (quasi-2D) perovskite type crystal structure can be obtained.

It is preferable that the total number of carbon atoms in the alkyl group and the cycloalkyl group represented by $R^{10}$ to $R^{13}$ is in a range of 1 to 4 and more preferable that $R^{10}$ represents an alkyl group having 1 to 3 carbon atoms and $R^{11}$ to $R^{13}$ represent a hydrogen atom.

[B]

In the perovskite compound, the constituent component B indicates a component positioned at the centers of the hexahedron where the constituent component A is disposed at each vertex and the octahedron where the constituent component X is disposed at each vertex in the perovskite type crystal structure and is a metal ion. The metal ion as the component B may be an ion formed of one or more selected from the group consisting of a monovalent metal ion, a divalent metal ion, and a trivalent metal ion. It is preferable that the component B contains a divalent metal ion and more preferable that the component B contains one or more metal ions selected from the group consisting of lead and tin.

[X]

In the perovskite compound, the constituent component X indicates a component positioned at each vertex of an octahedron having the constituent component B at the center in the perovskite type crystal structure and is one or more kinds of anions selected from the group consisting of a halide ion and a thiocyanate ion.

The constituent component X may be one or more anions selected from the group consisting of a chloride ion, a bromide ion, a fluoride ion, an iodide ion, and a thiocyanate ion.

The constituent component X can be appropriately selected according to a desired emission wavelength. For example, the constituent component X may contain a bromide ion.

In a case where the constituent component X is two or more kinds of halide ions, the content ratio of the halide ions can be appropriately selected according to the emission wavelength. For example, a combination of a bromide ion and a chloride ion or a combination of a bromide ion and an iodide ion can be employed.

Specific preferred examples of the compound which is represented by $ABX_{(3+\delta)}$ and has the perovskite type crystal structure of the three-dimensional structure in the perovskite compound include $CH_3NH_3PbBr_3$, $CH_3NH_3PbCl_3$, $CH_3NH_3PbI_3$, $CH_3NH_3PbBr_{(3-y)}I_y$ ($0<y<3$), $CH_3NH_3PbBr_{(3-y)}Cl_y$ ($0<y<3$), $(H_2N=CH-NH_2)PbBr_3$, $(H_2N=CH-NH_2)PbCl_3$, $(H_2N=CH-NH_2)PbI_3$,
$CH_3NH_3Pb_{(1-a)}Ca_aBr_3$ ($0<a\leq0.7$), $CH_3NH_3Pb_{(1-a)}Sr_aBr_3$ ($0<a\leq0.7$), $CH_3NH_3Pb_{(1-a)}La_aBr_{(3+\delta)}$ ($0<a\leq0.7$, $0\leq\delta\leq0.7$), $CH_3NH_3Pb_{(1-a)}Ba_aBr_3$ ($0<a\leq0.7$), $CH_3NH_3Pb_{(1-a)}Dy_aBr_{(3+\delta)}$ ($0<a\leq0.7$, $0\leq\delta\leq0.7$),
$CH_3NH_3Pb_{(1-a)}Na_aBr_{(3+\delta)}$ ($0<a\leq0.7$, $-0.7\leq\delta<0$), $CH_3NH_3Pb_{(1-a)}Li_aBr_{(3+\delta)}$ ($0<a\leq0.7$, $-0.7\leq\delta<0$),
$CsPb_{(1-a)}Na_aBr_{(3+\delta)}$ ($0<a\leq0.7$, $-0.7\leq\delta<0$), $CsPb_{(1-a)}Li_aBr_{(3+\delta)}$ ($0<a\leq0.7$, $-0.7\leq\delta<0$), $CH_3NH_3Pb_{(1-a)}Na_aBr_{(3+\delta-y)}I_y$ ($0<a\leq0.7$, $-0.7\leq\delta<0$, $0<y<3$),
$CH_3NH_3Pb_{(1-a)}Li_aBr_{(3+\delta-y)}I_y$ ($0<a\leq0.7$, $-0.7\leq\delta<0$, $0<y<3$), $CH_3NH_3Pb_{(1-a)}Na_aBr_{(3+\delta-y)}Cl_y$ ($0<a\leq0.7$, $-0.7\leq\delta<0$, $0<y<3$), $CH_3NH_3Pb_{(1-a)}Li_aBr_{(3+\delta-y)}Cl_y$ ($0<a\leq0.7$, $-0.7\leq\delta<0$, $0<y<3$),
$(H_2N=CH-NH_2)Pb_{(1-a)}Na_aBr_{(3+\delta)}$ ($0<a\leq0.7$, $-0.7\leq\delta\leq0$), $(H_2N=CH-NH_2)Pb_{(1-a)}Li_aBr_{(3+\delta)}$ ($0<a\leq0.7$, $-0.7\leq\delta\leq0$), $(H_2N=CH-NH_2)Pb_{(1-a)}Na_aBr_{(3+\delta-y)}I_y$ ($0<a\leq0.7$, $-0.7\leq\delta<0$, $0<y<3$), $(H_2N=CH-NH_2)Pb_{(1-a)}Na_aBr_{(3+\delta-y)}Cl_y$ ($0<a\leq0.7$, $-0.7\leq\delta<0$, $0<y<3$),
$CsPbBr_3$, $CsPbCl_3$, $CsPbI_3$, $CsPbBr_{(3-y)}I_y$ ($0<y<3$), $CsPbBr_{(3-y)}Cl_y$ ($0<y<3$), $CH_3NH_3PbBr_{(3-y)}Cl_y$ ($0<y<3$),
$CH_3NH_3Pb_{(1-a)}Zn_aBr_3$ ($0<a\leq0.7$), $CH_3NH_3Pb_{(1-a)}Al_aBr_{(3+\delta)}$ ($0<a\leq0.7$, $0<\delta\leq0.7$), $CH_3NH_3Pb_{(1-a)}Co_aBr_3$ ($0<a\leq0.7$), $CH_3NH_3Pb_{(1-a)}Mn_aBr_3$ ($0<a\leq0.7$), $CH_3NH_3Pb_{(1-a)}Mg_aBr_3$ ($0<a\leq0.7$),
$CsPb_{(1-a)}Zn_aBr_3$ ($0<a\leq0.7$), $CsPb_{(1-a)}Al_aBr_{(3+\delta)}$ ($0<a\leq0.7$, $0<\delta\leq0.7$), $CsPb_{(1-a)}Co_aBr_3$ ($0<a\leq0.7$), $CsPb_{(1-a)}Mn_aBr_3$ ($0<a\leq0.7$), $CsPb_{(1-a)}Mg_aBr_3$ ($0<a\leq0.7$),
$CH_3NH_3Pb_{(1-a)}Br_{(3-y)}I_y$ ($0<a\leq0.7$, $0<y<3$), $CH_3NH_3Pb_{(1-a)}Al_aBr_{(3+\delta-y)}I_y$ ($0<a\leq0.7$, $0<\delta\leq0.7$, $0<y<3$), $CH_3NH_3Pb_{(1-a)}Co_aBr_{(3-y)}I_y$ ($0<a\leq0.7$, $0<y<3$), $CH_3NH_3Pb_{(1-a)}Mn_aBr_{(3-y)}I_y$ ($0<a\leq0.7$, $0<y<3$), $CH_3NH_3Pb_{(1-a)}Mg_aBr_{(3-y)}I_y$ ($0<a\leq0.7$, $0<y<3$), $CH_3NH_3Pb_{(1-a)}ZnBr_{(3-y)}Cl_y$ ($0<a\leq0.7$, $0<y<3$), $CH_3NH_3Pb_{(1-a)}Al_aBr_{(3+\delta-y)}Cl_y$ ($0<a\leq0.7$, $0<\delta\leq0.7$, $0<y<3$), $CH_3NH_3Pb_{(1-a)}Co_aBr_{(3-y)}Cl_y$ ($0<a\leq0.7$, $0<y<3$), $CH_3NH_3Pb_{(1-a)}Mn_aBr_{(3-y)}Cl_y$ ($0<a\leq0.7$, $0<y<3$), $CH_3NH_3Pb_{(1-a)}Mg_aBr_{(3-y)}Cl_y$ ($0<a\leq0.7$, $0<y<3$),
$(H_2N=CH-NH_2)Zn_aBr_3$ ($0<a\leq0.7$), $(H_2N=CH-NH_2)Mg_aBr_3$ ($0<a\leq0.7$), $(H_2N=CH-NH_2)Pb_{(1-a)}Zn_aBr_{(3-y)}I_y$ ($0<a\leq0.7$, $0<y<3$), and $(H_2N=CH-NH_2)Pb_{(1-a)}Zn_aBr_{(3-y)}Cl_y$ ($0<a\leq0.7$, $0<y<3$).

According to one aspect of the present invention, as the perovskite compound which is a compound represented by $ABX_{(3+\delta)}$ and having the perovskite type crystal structure of the three-dimensional structure, $CsPbBr_3$ or $CsPbBr_{(3-y)}I_y$ ($0<y<3$) is preferable.

Specific preferred examples of the compound which is represented by $A_2BX_{(4+\delta)}$ and has the perovskite type crystal structure of the two-dimensional structure in the perovskite compound include $(C_4H_9NH_3)_2PbBr_4$, $(C_4H_9NH_3)_2PbCl_4(C_4H_9NH_3)_2PbI_4$, $(C_7H_{15}NH_3)_2PbBr_4$, $(C_7H_{15}NH_3)_2PbCl_4$, $(C_7H_{15}NH_3)_2PbI_4$, $(C_4H_9NH_3)_2Pb_{(1-a)}Li_aBr_{(4+\delta)}$ ($0<a\leq0.7$, $-0.7\leq\delta<0$), $(C_4H_9NH_3)_2Pb_{(1-a)}Na_aBr_{(4+\delta)}$ ($0<a\leq0.7$, $-0.7\leq\delta<0$), $(C_4H_9NH_3)_2Pb_{(1-a)}Rb_aBr_{(4+\delta)}$ ($0<a\leq0.7$, $-0.7\leq\delta<0$), $(C_7H_{15}NH_3)_2Pb_{(1-a)}Na_aBr_{(4+\delta)}$ ($0<a\leq0.7$, $-0.7\leq\delta<0$), $(C_7H_{15}NH_3)_2Pb_{(1-a)}Li_aBr_{(4+\delta)}$ ($0<a\leq0.7$, $-0.7\leq\delta<0$), $(C_7H_{15}NH_3)_2Pb_{(1-a)}Rb_aBr_{(4+\delta)}$($0<a\leq0.7$, $-0.7\leq\delta<0$), $(C_4H_9NH_3)_2Pb_{(1-a)}Na_aBr_{(4+\delta-y)}I_y$ ($0<a\leq0.7$, $-0.7\leq\delta<0$, $0<y<4$), $(C_4H_9NH_3)_2Pb_{(1-a)}Li_aBr_{(4+\delta-y)}I_y$ ($0<a\leq0.7$, $-0.7\leq\delta<0$, $0<y<4$), $(C_4H_9NH_3)_2Pb_{(1-a)}Rb_aBr_{(4+\delta-y)}Cl_y$ ($0<a\leq0.7$, $0<y<4$), $(C_4H_9NH_3)_2Pb_{(1-a)}Na_aBr_{(4+\delta-y)}Cl_y$ ($0<a\leq0.7$, $-0.7\leq\delta<0$, $0<y<4$), $(C_4H_9NH_3)_2Pb_{(1-a)}Li_aBr_{(4+\delta-y)}Cl_y$ ($0<a\leq0.7$, $-0.7\leq\delta<0$, $0<y<4$), $(C_4H_9NH_3)_2Pb_{(1-a)}Rb_aBr_{(4+\delta-y)}Cl_y$ ($0<a\leq0.7$, $-0.7\leq\delta<0$, $0<y<4$), $(C_4H_9NH_3)_2PbBr_4$, $(C_7H_{15}NH_3)_2PbBr_4$, $(C_4H_9NH_3)_2PbBr_{(4-y)}Cl_y$ ($0<y<4$), $(C_4H_9NH_3)_2PbBr_{(4-y)}I_y$ ($0<y\leq4$), $(C_4H_9NH_3)_2Pb_{(1-a)}Zn_aBr_4$ ($0<a\leq0.7$), $(C_4H_9NH_3)_2Pb_{(1-a)}Mg_aBr_4$ ($0<a\leq0.7$), $(C_4H_9NH_3)_2Pb_{(1-a)}Co_aBr_4$ ($0<a\leq0.7$), $(C_4H_9NH_3)_2Pb_{(1-a)}Mn_aBr_4$ ($0<a\leq0.7$), $(C_7H_{15}NH_3)_2Pb_{(1-a)}Zn_aBr_4$ ($0<a\leq0.7$), $(C_7H_{15}NH_3)_2Pb_{(1-a)}Mg_aBr_4$ ($0<a\leq0.7$), $(C_7H_{15}NH_3)_2Pb_{(1-a)}Co_aBr_4$ ($0<a\leq0.7$), $(C_7H_{15}NH_3)_2Pb_{(1-a)}Mn_aBr_4$ ($0<a\leq0.7$), $(C_4H_9NH_3)_2Pb_{(1-a)}Zn_aBr_{(4-y)}I_y$ ($0<a\leq0.7$, $0<y<4$), $(C_4H_9NH_3)_2Pb_{(1-a)}Mg_aBr_{(4-y)}I_y$ ($0<a\leq0.7$, $0<y<4$), $(C_4H_9NH_3)_2Pb_{(1-a)}Co_aBr_{(4-y)}I_y$ ($0<a\leq0.7$, $0<y<4$), $(C_4H_9NH_3)_2Pb_{(1-a)}Mn_aBr_{(4-y)}I_y$ ($0<a\leq0.7$, $0<y<4$), $(C_4H_9NH_3)_2Pb_{(1-a)}Zn_aBr_{(4-y)}Cl_y$ ($0<a\leq0.7$, $0<y<4$), $(C_4H_9NH_3)_2Pb_{(1-a)}Mg_aBr_{(4-y)}Cl_y$ ($0<a\leq0.7$, $0\leq\delta\leq0.7$, $0<y<4$), $(C_4H_9NH_3)_2Pb_{(1-a)}Co_aBr_{(4-y)}Cl_y$ ($0<a\leq0.7$, $0<y<4$), and $(C_4H_9NH_3)_2Pb_{(1-a)}Mn_aBr_{(4-y)}Cl_y$ ($0<a\leq0.7$, $0<y<4$).

The average particle diameter of the perovskite compound contained in the mixture is not particularly limited, but the average particle diameter thereof is preferably 1 nm or greater, more preferably 2 nm or greater, and still more preferably 3 nm or greater from the viewpoint of satisfactorily maintaining the crystal structure. Further, the average particle diameter thereof is preferably 10 μm or less, more preferably 1 μm or less, and still more preferably 500 nm or less from the viewpoint of making the perovskite compound difficult to be settled out.

The above-described upper limit and lower limit can be optionally combined.

The average particle diameter of the perovskite compound contained in the mixture is not particularly limited, but the average particle diameter thereof is preferably in a range of 1 nm to 10 μm, more preferably in a range of 2 nm to 1 μm, and still more preferably 3 nm to 500 nm from the viewpoints of making the perovskite compound difficult to be settled out and satisfactorily maintaining the crystal structure.

In the present specification, the average particle diameter of the perovskite compound contained in the mixture can be measured using, for example, a transmission electron microscope (hereinafter, also referred to as a TEM) and a scanning electron microscope (hereinafter, also referred to as a SEM). Specifically, the average particle diameter can be acquired by observing the maximum Feret diameter of twenty perovskite compounds contained in the mixture using a TEM or a SEM and calculating the average maximum Feret diameter which is an average value thereof obtained values. The "maximum Feret diameter" in the present specification indicates the maximum distance between two straight lines parallel to each other which interpose the perovskite compound therebetween on a TEM or SEM image.

The median diameter (D50) of the perovskite compound contained in the mixture is not particularly limited, but the median diameter (D50) thereof is preferably 2 nm or greater, more preferably 3 nm or greater, and still more preferably 4 nm or greater from the viewpoint of satisfactorily maintaining the crystal structure. Further, the median diameter (D50) thereof is preferably 5 μm or less, more preferably 500 nm or less, and still more preferably 100 nm or less from the viewpoint of making the perovskite compound according to the present invention difficult to be settle out.

According to another aspect of the present invention, the median diameter (D50) of the perovskite compound contained in the mixture in the particle size distribution is preferably in a range of 2 nm to 5 μm, more preferably in a range of 3 nm to 500 nm, and still more preferably in a range of 4 nm to 100 nm.

In the present specification, the particle size distribution of the perovskite compound contained in the mixture can be measured using, for example, a TEM or a SEM. Specifically, the median diameter (D50) thereof can be acquired by observing the maximum Feret diameter of twenty perovskite compounds contained in the mixture using a TEM or a SEM and calculating the median diameter based on the distribution.

<<Emission Spectrum>>

The perovskite compound is a light emitting material which is capable of emitting fluorescence in a visible light wavelength range. In a case where the constituent component X is a bromide ion, the compound is capable of emitting fluorescence having a maximum peak of the intensity in a wavelength range of typically 480 nm or greater, preferably 500 nm or greater, and more preferably 520 nm or greater and typically 700 nm or less, preferably 600 nm or less, and more preferably 580 nm or less.

The above-described upper limit and lower limit can be optionally combined.

According to another aspect of the present invention, in the case where the constituent component X in the perovskite compound is a bromide ion, the peak of the emitted fluorescence is typically in a range of 480 nm to 700 nm, preferably in a range of 500 nm to 600 nm, and more preferably in a range of 520 nm to 580 nm.

In a case where the constituent component X is an iodide ion, the compound is capable of emitting fluorescence having a maximum peak of the intensity in a wavelength range of typically 520 nm or greater, preferably 530 nm or greater, and more preferably 540 nm or greater and typically 800 nm or less, preferably 750 nm or less, and more preferably 730 nm or less.

The above-described upper limit and lower limit can be optionally combined.

According to another aspect of the present invention, in the case where the constituent component X in the perovskite compound is an iodide ion, the peak of the emitted fluorescence is typically in a range of 520 nm to 800 nm, preferably in a range of 530 nm to 750 nm, and more preferably in a range of 540 nm to 730 nm.

In a case where the constituent component X is a chloride ion, the compound is capable of emitting fluorescence having a maximum peak of the intensity in a wavelength range of typically 300 nm or greater, preferably 310 nm or greater, and more preferably 330 nm or greater and typically 600 nm or less, preferably 580 nm or less, and more preferably 550 nm or less.

The above-described upper limit and lower limit can be optionally combined.

According to another aspect of the present invention, in the case where the constituent component X in the perovskite compound is a chloride ion, the peak of the emitted fluorescence is typically in a range of 300 nm to 600 nm, preferably in a range of 310 nm to 580 nm, and more preferably in a range of 330 nm to 550 nm.

Light-Emitting Indium Compound or Light-Emitting Cadmium Compound (2)

Examples of the indium compound include a Group III-V indium compound, a Group III-VI indium compound, and a Group I-III-VI indium compound.

As the indium compound, a Group III-V indium compound is preferable, and an indium compound having a phosphorous element as a Group V element is preferable.

Examples of the cadmium compound include a Group II-VI cadmium compound and a Group II-V cadmium compound.

The indium compound does not have a cadmium element and the cadmium compound does not have an indium element.

It is preferable that the indium compound and the cadmium compound are respectively a semiconductor containing an indium compound and a semiconductor containing a cadmium compound.

The average particle diameter of the indium compound or cadmium compound contained in the mixture is not particularly limited. However, from the viewpoint of exhibiting excellent light emission, the average particle diameter of the cadmium compound is preferably 1.0 nm or greater, more preferably 1.1 nm or greater, and still more preferably 1.2 nm or greater and preferably 100 nm or less, more preferably 10 nm or less, and still more preferably 8 nm or less. Further, the average particle diameter of the indium compound is preferably 0.8 nm or greater, more preferably 1.0 nm or greater, and still more preferably 1.1 nm or greater and preferably 30 nm or less, more preferably 10 nm or less, and still more preferably 4 nm or less.

The above-described upper limit and lower limit can be optionally combined.

According to another aspect of the present invention, the average particle diameter of the cadmium compound contained in the mixture is preferably in a range of 1.0 nm to 100 nm, more preferably in a range of 1.1 nm to 10 nm, and still more preferably in a range of 1.2 nm to 8 nm.

According to still another aspect of the present invention, the average particle diameter of the indium compound contained in the mixture is preferably in a range of 0.8 nm to 30 nm, more preferably in a range of 1.0 nm to 10 nm, and still more preferably in a range of 1.1 nm to 4 nm.

In the present specification, the average particle diameter of the cadmium compound and the indium compound contained in the mixture can be measured using, for example, a TEM or a SEM. Specifically, the average particle diameter can be acquired by observing the maximum Feret diameter of twenty cadmium compounds or indium compounds contained in the mixture using a TEM or a SEM and calculating the average maximum Feret diameter which is an average value thereof obtained values.

(Group III-V Indium Compound)

A Group III-V indium compound is a compound having a Group III element and a Group V element and is a compound having at least an indium element.

Here, the Group III indicates a Group 13 of the periodic table and the Group V indicates a Group 15 of the periodic table (the same applies hereinafter).

Further, the "periodic table" in the present specification indicates a long-period periodic table.

The Group III-V indium compound may be binary, ternary, or quaternary.

A binary Group III-V indium compound may be a compound having an indium element (first element) and a Group V element (second element), and examples thereof include InN, InP, InAs, and InSb.

A ternary Group III-V indium compound may be a compound having an indium element (first element) and two kinds of elements (second elements) selected from Group V elements or a compound having two kinds of elements (first elements) selected from Group III elements, one of which is an indium element, and one kind of element (second element) selected from Group V elements.

Examples of the ternary Group III-V indium compound include InPN, InPAs, InPSb, and InGaP.

A quaternary Group III-V indium compound is a compound having two kinds of elements (first elements) selected from Group III elements, one of which is an indium element, and two kinds of elements (second elements) selected from Group V elements.

Examples of the quaternary Group III-V indium compound include InGaPN, InGaPAs, and InGaPSb.

A semiconductor containing the Group III-V indium compound may have elements (excluding elements of cadmium) other than the Group 13 element and the Group 15 element of the periodic table, as doping elements.

(Group III-VI Indium Compound)

The Group III-VI indium compound is a compound having a Group III element and a Group VI element and is a compound having at least an indium element.

Here, the Group VI indicates a Group 16 of the periodic table (the same applies hereinafter).

The Group III-VI indium compound may be binary, ternary, or quaternary.

A binary Group III-VI indium compound may be a compound having an indium element (first element) and a Group VI element (second element), and examples thereof include $In_2S_3$, $In_2Se_3$, and $In_2Te_3$.

A ternary Group III-VI indium compound may be a compound having an indium element (first element) and two kinds of elements (second elements) selected from Group VI elements or a compound having two kinds of elements (first elements) selected from Group III elements, one of which is an indium element, and one kind of element (second element) selected from Group VI elements.

Examples of the ternary Group III-VI indium compound include $InGaS_3$, $InGaSe_3$, $InGaTe_3$, $In_2SSe_2$, and $In_2TeSe_2$.

A quaternary Group III-VI indium compound is a compound having two kinds of elements (first elements) selected from Group III elements, one of which is an indium element, and two kinds of elements (second elements) selected from Group VI elements.

Examples of the quaternary Group III-VI indium compound include $InGaSSe_2$, $InGaSeTe_2$, and $InGaSTe_2$.

A semiconductor containing the Group III-VI indium compound may have elements (excluding elements of cadmium) other than the Group 13 element and the Group 16 element of the periodic table, as doping elements.

(Group I-III-VI Indium Compound)

The Group I-III-VI indium compound is a compound having a Group I element, a Group III element, and a Group VI element and is a compound having at least an indium element.

Here, the Group I indicates a Group 11 of the periodic table (the same applies hereinafter).

The Group I-III-VI indium compound may be ternary or quaternary.

A ternary Group I-III-VI indium compound may be a compound having an element (first element) selected from Group I elements, an indium element (second element), and a Group (third element) selected from Group VI elements.

Examples of the ternary I-III-VI indium compound include $CuInS_2$.

A semiconductor containing the Group I-III-VI indium compound may have elements (excluding elements of cadmium) other than the Group 11 element, the Group 13 element, and the Group 16 element of the periodic table, as doping elements.

From the viewpoint of obtaining sufficient emission intensity, InP, $CuInS_2$, InNP, or GaInNP is preferable and InP or $CuInS_2$ is more preferable as the indium compound.

(Group II-VI Cadmium Compound)

The Group II-VI indium compound is a compound having a Group II element and a Group VI element and is a compound having at least an indium element.

Here, the Group II indicates a Group 2 or 12 of the periodic table (the same applies hereinafter).

The Group II-VI cadmium compound may be binary, ternary, or quaternary. A binary Group II-VI cadmium compound may be a compound having a cadmium element (first element) and a Group 16 element (second element), and examples thereof include CdS, CdSe, and CdTe.

A ternary Group II-VI cadmium compound may be a compound having a cadmium element (first element) and two kinds of elements (second elements) selected from Group VI elements or a compound having two kinds of elements (first elements) selected from Group II elements, one of which is a cadmium element, and one kind of element (second element) selected from Group VI elements.

Examples of the ternary Group II-VI cadmium compound include CdSeS, CdSeTe, CdSTe, CdZnS, CdZnSe, CdZnTe, CdHgS, CdHgSe, and CdHgTe.

A quaternary Group II-VI cadmium compound is a compound having two kinds of elements (first elements) selected from Group II elements, one of which is a cadmium element, and two kinds of elements (second elements) selected from Group VI elements. Examples of the quaternary Group II-VI cadmium compound include CdZnSeS, CdZnSeTe, CdZnSTe, CdHgSeS, CdHgSeTe, and CdHgSTe.

A semiconductor containing the Group II-VI cadmium compound may have elements (excluding elements of indium) other than the Group 2 element, the Group 12 element, and the Group 16 element of the periodic table, as doping elements.

(Group II-V Cadmium Compound)

The Group II-V cadmium compound is a compound having a Group II element and a Group V element and is a compound having at least a cadmium element.

Here, the Group II-V cadmium compound may be binary, ternary, or quaternary.

A binary Group II-V cadmium compound may be a compound having a cadmium element (first element) and a Group V element (second element), and examples thereof include $Cd_3P_2$, $Cd_3As_2$, and $Cd_3N_2$.

A ternary Group II-V cadmium compound may be a compound having a cadmium element (first element) and two kinds of elements (second elements) selected from Group V elements or a compound having two kinds of elements (first elements) selected from Group II elements, one of which is a cadmium element, and one kind of element (second element) selected from Group V elements.

Examples of the ternary Group II-V cadmium compound include $Cd_3PN$, $Cd_3PAs$, $Cd_3AsN$, $Cd_2ZnP_2$, $Cd_2ZnAs_2$, and $Cd_2ZnN_2$.

A quaternary Group II-V cadmium compound is a compound having two kinds of elements (first elements) selected from Group II elements, one of which is a cadmium element, and two kinds of elements (second elements) selected from Group V elements.

Examples of the quaternary Group II-V cadmium compound include CdZnPN, CdZnPAs, and $Cd_2ZnAsN$.

A semiconductor containing the Group II-V cadmium compound may have elements (excluding elements of indium) other than the Group 2 element, the Group 12 element, and the Group 15 element of the periodic table, as doping elements.

From the viewpoint of obtaining sufficient emission intensity, as the cadmium compound, CdS, CdSe, ZnCdS, CdSeS, CdSeTe, CdSTe, CdZnS, CdZnSe, CdZnTe, ZnCdSe, CdZnSeS, CdZnSeTe, or CdZnSTe is preferable, CdS, CdSe, ZnCdS, CdSeS, CdZnS, CdZnSe, ZnCdSSe, or CdZnSeS is more preferable, CdS, CdSe, ZnCdS, ZnCdSSe, or CdZnSeS is still more preferable, and CdSe or CdZnSeS is particularly preferable.

The indium compound or cadmium compound (2) contained in the mixture may have an inorganic protective layer on the surface of each particle in order to improve the emission intensity or the durability.

The inorganic protective layer may be formed of two or more layers or one layer.

As an inorganic material which can form the inorganic protective layer, a semiconductor having a larger band gap than that of the indium compound or cadmium compound (2) in the mixture is an exemplary example, but the present invention is not limited thereto.

For example, the inorganic protective layer is formed of a known inorganic material such as ZnS.

<<Emission Spectrum>>

The indium compound or cadmium compound is a light emitting material which is capable of emitting fluorescence in a visible light wavelength range.

In a case where the average particle diameter of the indium compound is 1 nm or greater and less than 2 nm, the indium compound is capable of emitting fluorescence having a maximum peak of the emission intensity in a wavelength range of typically 300 nm or greater, preferably 310 nm or greater, and more preferably 330 nm or greater and typically 600 nm or less, preferably 580 nm or less, and more preferably 550 nm or less.

In other words, in a case where the average particle diameter of the indium compound is 1 nm or greater and less than 2 nm, the indium compound is capable of emitting fluorescence having a maximum peak of the emission intensity in a wavelength range of typically 300 nm to 600 nm, preferably 310 nm to 580 nm, and more preferably 330 nm to 550 nm or less.

In a case where the average particle diameter of the indium compound is 2 nm or greater and less than 3 nm, the indium compound is capable of emitting fluorescence having a maximum peak of the emission intensity in a wavelength range of typically 480 nm or greater, preferably 500 nm or greater, and more preferably 520 nm or greater and typically 700 nm or less, preferably 600 nm or less, and more preferably 580 nm or less.

In other words, in a case where the average particle diameter of the indium compound is 2 nm or greater and less than 3 nm, the indium compound is capable of emitting fluorescence having a maximum peak of the emission intensity in a wavelength range of typically 480 nm to 700 nm, preferably 500 nm to 600 nm, and more preferably 520 nm to 580 nm or less.

In a case where the average particle diameter of the indium compound is 3 nm or greater, the indium compound is capable of emitting fluorescence having a maximum peak of the intensity in a wavelength range of typically 520 nm or greater, preferably 530 nm or greater, and more preferably 540 nm or greater and typically 800 nm or less, preferably 750 nm or less, and more preferably 730 nm or less.

In other words, in a case where the average particle diameter of the indium compound is 3 nm or greater, the indium compound is capable of emitting fluorescence having a maximum peak of the intensity in a wavelength range of typically 520 nm to 800 nm, preferably 540 nm to 750 nm, and more preferably 540 nm to 730 nm.

In a case where the average particle diameter of the cadmium compound is 1 nm or greater and less than 3 nm, the cadmium compound is capable of emitting fluorescence having a maximum peak of the emission intensity in a wavelength range of typically 300 nm or greater, preferably 310 nm or greater, and more preferably 330 nm or greater and typically 600 nm or less, preferably 580 nm or less, and more preferably 550 nm or less.

In other words, in a case where the average particle diameter of the cadmium compound is 1 nm or greater and less than 3 nm, the cadmium compound is capable of emitting fluorescence having a maximum peak of the emission intensity in a wavelength range of typically 300 nm to 600 nm, preferably 310 nm to 580 nm, and more preferably 330 nm to 550 nm or less.

In a case where the average particle diameter of the cadmium compound is 3 nm or greater and less than 6 nm, the cadmium compound is capable of emitting fluorescence having a maximum peak of the emission intensity in a wavelength range of typically 480 nm or greater, preferably 500 nm or greater, and more preferably 520 nm or greater and typically 700 nm or less, preferably 600 nm or less, and more preferably 580 nm or less.

In other words, in a case where the average particle diameter of the cadmium compound is 3 nm or greater and less than 6 nm, the cadmium compound is capable of emitting fluorescence having a maximum peak of the emission intensity in a wavelength range of typically 480 nm to 700 nm, preferably 500 nm to 600 nm, and more preferably 520 nm to 580 nm or less.

In a case where the average particle diameter of the cadmium compound is 6 nm or greater, the cadmium compound is capable of emitting fluorescence having a maximum peak of the emission intensity in a wavelength range of typically 520 nm or greater, preferably 530 nm or greater, and more preferably 540 nm or greater and typically 800 nm or less, preferably 750 nm or less, and more preferably 730 nm or less.

In other words, in a case where the average particle diameter of the cadmium compound is 6 nm or greater, the cadmium compound is capable of emitting fluorescence having a maximum peak of the emission intensity in a wavelength range of typically 520 nm to 800 nm, preferably 530 nm to 750 nm, and more preferably 540 nm to 730 nm or less.

(3) Solvent

The solvent is not particularly limited as long as the solvent is a medium in which the compound (1) and the compound (2) can be dispersed. Further, a solvent in which the compound (1) and the compound (2) are unlikely to be dissolved is preferable. In the present specification, the "solvent" indicates a substance (excluding a polymerizable compound and a polymer) that enters a liquid state at 25° C. and 1 atm.

In the present specification, the term "dispersed" indicates a state in which the perovskite compound, the indium compound, or the cadmium compound is floated or suspended in a solvent, a polymerizable compound, or a polymer or may be partially settled out.

Examples of the solvent include an ester such as methyl formate, ethyl formate, propyl formate, pentyl formate, methyl acetate, ethyl acetate, or pentyl acetate; a ketone such as γ-butyrolactone, acetone, dimethyl ketone, diisobutyl ketone, cyclopentanone, cyclohexanone, or methyl cyclohexanone; an ether such as diethyl ether, methyl-tert-butyl ether, diisopropyl ether, dimethoxymethane, dimethoxyethane, 1,4-dioxane, 1,3-dioxolane, 4-methyldioxolane, tetrahydrofuran, methyl tetrahydrofuran, anisole, or phenetole; an alcohol such as methanol, ethanol, 1-propanol, 2-propanol, 1-butanol, 2-butanol, tert-butanol, 1-pentanol, 2-methyl-2-butanol, methoxypropanol, diacetone alcohol, cyclohexanol, 2-fluoroethanol, 2,2,2-trifluoroethanol, or 2,2,3,3-tetrafluoro-1-propanol; a glycol ether such as ethylene glycol monomethyl ether, ethylene glycol monoethyl ether, ethylene glycol monobutyl ether, ethylene glycol monoethyl ether acetate, or triethylene glycol dimethyl ether; an organic solvent containing an amide group such as N-methyl-2-pyrrolidone, N,N-dimethylformamide, acetamide, or N,N-dimethylacetamide; an organic solvent containing a nitrile group such as acetonitrile, isobutyronitrile, propionitrile, or methoxy acetonitrile; an organic solvent containing a hydrocarbon group such as ethylene carbonate or propylene carbonate; an organic solvent containing a halogenated hydrocarbon group such as methylene chloride or chloroform; an organic solvent containing a hydrocarbon group such as n-pentane, cyclohexane, n-hexane, benzene, toluene, or xylene; and dimethyl sulfoxide.

Among these, an ester such as methyl formate, ethyl formate, propyl formate, pentyl formate, methyl acetate, ethyl acetate, or pentyl acetate; a ketone such as γ-butyrolactone, acetone, dimethyl ketone, diisobutyl ketone, cyclopentanone, cyclohexanone, or methyl cyclohexanone; an ether such as diethyl ether, methyl-tert-butyl ether, diisopropyl ether, dimethoxymethane, dimethoxyethane, 1,4-dioxane, 1,3-dioxolane, 4-methyldioxolane, tetrahydrofuran, methyl tetrahydrofuran, anisole, or phenetole; an organic solvent containing a nitrile group such as acetonitrile, isobutyronitrile, propionitrile, or methoxyacetonitrile; an organic solvent containing a carbonate group such as ethylene carbonate or propylene carbonate; an organic solvent containing a halogenated hydrocarbon group such as methylene chloride or chloroform; or an organic solvent containing a hydrocarbon group such as n-pentane, cyclohexane, n-hexane, benzene, toluene, or xylene is preferable from the viewpoint that the polarity is low and the compound (1) and the compound (2) are unlikely to be dissolved therein, and an organic solvent containing a halogenated hydrocarbon group such as methylene chloride or chloroform; or an organic solvent containing a hydrocarbon group such as n-pentane, cyclohexane, n-hexane, benzene, toluene, or xylene is more preferable.

Polymerizable Compound or Polymer (4)

The polymerizable compound contained in the mixture according to the present embodiment is not particularly limited, and one or two or more kinds thereof may be used. As the polymerizable compound, a polymerizable compound with a low solubility of the compound (1) and the compound (2) at the temperature at which the mixture according to the present embodiment is produced is preferable.

In the present specification, the "polymerizable compound" indicates a compound of a monomer containing a polymerizable group.

For example, in a case where the mixture is produced at room temperature under normal pressure, the polymerizable compound is not particularly limited, and examples thereof include known polymerizable compounds such as styrene and methyl methacrylate. Among these, any one or both of acrylic acid ester and methacrylic acid ester serving as a monomer component of an acrylic resin are preferable as the polymerizable compound.

The polymer contained in the mixture according to the present embodiment is not particularly limited, and one or two or more kinds thereof may be used. As the polymer, a polymer with a low solubility of the compound (1) and the compound (2) at the temperature at which the mixture according to the present embodiment is produced is preferable.

Examples thereof include known polymers such as polystyrene, a methacrylic resin, silicone, and a cycloolefin polymer. Among these, from the viewpoints of having a higher transparency and efficiently extracting emitted light, silicone, a cycloolefin polymer, or an acrylic resin is preferable as the polymer. The acrylic resin has a constitutional unit derived from any one or both of acrylic acid ester and methacrylic acid ester.

In the mixture according to the present embodiment, the amount of the acrylic acid ester and/or methacrylic acid ester and the constitutional unit derived from these may be 10% by mole or greater, 30% by mole or greater, 50% by mole or greater, 80% by mole or greater, or 100% by mole or greater with respect to the amount of all constitutional units contained in the polymerizable compound or polymer (4).

At least one compound (5) selected from group consisting of ammonia, amine, carboxylic acid, and salts or ions thereof.

Along with the ammonia, the amine, and the carboxylic acid, the mixture according to the present embodiment may contain at least one compound selected from the group consisting of salts and ions thereof as the form which can be employed by these compounds.

In other words, the mixture according to the present embodiment may contain at least one compound selected from the group consisting of ammonia, an amine, a carboxylic acid, a salt of the ammonia, a salt of the amine, a salt of the carboxylic acid, an ion of the ammonia, an ion of the amine, and an ion of the carboxylic acid.

The ammonia, the amine, the carboxylic acid, and the salts and the ions thereof typically function as capping ligands. The capping ligand is a compound having a function of being adsorbed on the surface of the compound (1) or compound (2) and stably dispersing the compound (1) or compound (2) in the mixture.

Examples of the ions or salts (such as an ammonium salt) of the ammonia or amine include an ammonium cation represented by Formula (A1) and an ammonium salt containing the ammonium cation.

Examples of the ions or salts (such as a carboxylate) of the carboxylic acid include a carboxylate anion represented by Formula (A2) and a carboxylate containing the carboxylate anion.

The mixture according to the present embodiment may contain any one or both of an ammonium salt and a carboxylate.

(A1)

In Formula (A1), $R^1$ to $R^3$ represent a hydrogen atom, and $R^4$ represents a hydrogen atom or a monovalent hydrocarbon group. It is preferable that $R^4$ represents a monovalent hydrocarbon group. The monovalent hydrocarbon group may be a saturated hydrocarbon group (in other words, an alkyl group or a cycloalkyl group) or an unsaturated hydrocarbon group.

The alkyl group represented by $R^4$ may be linear or branched.

The number of carbon atoms of the alkyl group represented by $R^4$ is typically in a range of 1 to 20, preferably in a range of 5 to 20, and more preferably in a range of 8 to 20.

The cycloalkyl group represented by $R^4$ may contain an alkyl group as a substituent. The number of carbon atoms in the cycloalkyl group is typically in a range of 3 to 30, preferably in a range of 3 to 20, and more preferably in a range of 3 to 11. The number of carbon atoms include the number of carbon atoms in a substituent.

The unsaturated hydrocarbon group as $R^4$ may be linear or branched.

The number of carbon atoms in the unsaturated hydrocarbon group as $R^4$ is typically in a range of 2 to 20, preferably in a range of 5 to 20, and more preferably in a range of 8 to 20.

It is preferable that $R^4$ represents a hydrogen atom, an alkyl group, or an unsaturated hydrocarbon group. As the unsaturated hydrocarbon group, an alkenyl group is preferable. It is preferable that $R^4$ represents an alkenyl group having 8 to 20 carbon atoms.

Specific examples of the alkyl group as $R^4$ include those provided as exemplary examples of the alkyl group represented by $R^6$ to $R^9$.

Specific examples of the cycloalkyl group as $R^4$ include those provided as exemplary examples of the cycloalkyl group represented by $R^6$ to $R^9$.

As the alkenyl group represented by $R^4$, a group in which any one single bond (C—C) between carbon atoms is substituted with a double bond (C=C) in the alkyl group as $R^6$ to $R^9$ is an exemplary example, and the position of the double bond is not limited.

Preferred examples of such an alkenyl group include an ethenyl group, a propenyl group, a 3-butenyl group, a 2-butenyl group, a 2-pentenyl group, a 2-hexenyl group, a 2-nonenyl group, a 2-dodecenyl group, and a 9-octadecenyl group.

In a case of forming a salt, the counter ion is not particularly limited, and preferred examples thereof include halide ions such as Br—, Cl—, I—, and F—; and carboxylate ions.

Preferred examples of the ammonium cation represented by Formula (A1) and the ammonium salt containing a counter anion include an n-octylammonium salt and an oleyl ammonium salt.

Examples of the carboxylate include a carboxylate containing a carboxylate anion represented by Formula (A2).

$$R^5\text{—}CO_2^-\qquad(A2)$$

In Formula (A2), $R^5$ represents a monovalent hydrocarbon group.

The monovalent hydrocarbon group may be a saturated hydrocarbon group (in other words, an alkyl group or a cycloalkyl group) or an unsaturated hydrocarbon group.

The alkyl group represented by $R^5$ may be linear or branched. The number of carbon atoms of the alkyl group represented by $R^5$ is typically in a range of 1 to 20, preferably in a range of 5 to 20, and more preferably in a range of 8 to 20.

The cycloalkyl group represented by $R^5$ may contain an alkyl group as a substituent. The number of carbon atoms in the cycloalkyl group is typically in a range of 3 to 30, preferably in a range of 3 to 20, and more preferably in a range of 3 to 11. The number of carbon atoms include the number of carbon atoms in a substituent.

The unsaturated hydrocarbon group as $R^5$ may be linear or branched.

The number of carbon atoms in the unsaturated hydrocarbon group as $R^5$ is typically in a range of 2 to 20, preferably in a range of 5 to 20, and more preferably in a range of 8 to 20.

It is preferable that $R^5$ represents an alkyl group or an unsaturated hydrocarbon group. As the unsaturated hydrocarbon group, an alkenyl group is preferable.

Specific examples of the alkyl group as $R^5$ include those provided as exemplary examples of the alkyl group represented by $R^6$ to $R^9$.

Specific examples of the cycloalkyl group as $R^5$ include those provided as exemplary examples of the cycloalkyl group represented by $R^6$ to $R^9$.

Specific examples of the alkenyl group as $R^5$ include those provided as exemplary examples of the alkenyl group represented by $R^1$ to $R^4$.

As the carboxylate anion represented by Formula (A2), an oleate anion is preferable.

In a case of forming a salt, the counter cation of the carboxylate anion represented by Formula (A2) is not particularly limited, and preferred examples thereof include an alkali metal ion, an alkaline earth metal cation, and an ammonium cation.

<Regarding Compounding Ratio of Each Component>

The compounding ratio between the compound (1) and the compound (2) in the mixture according to the present embodiment may be at the level where two emission peaks can be confirmed and can be appropriately determined depending on the kind and the like of the compound (1) and the compound (2).

In the mixture according to the present embodiment, for example, the molar ratio [(indium or cadmium)/(B)] between the metal ion of the component B in the perovskite compound (1) and the indium element of the indium compound (2) or the cadmium element of the cadmium compound (2) may be in a range of 0.001 to 1000, in a range of 0.01 to 500, or in a range of 0.01 to 300.

In a case where the indium compound or cadmium compound (2) in the mixture according to the present embodiment is a cadmium compound, the molar ratio [(cadmium)/(B)] between the metal ion of the component B in the perovskite compound and the cadmium element of the cadmium compound may be in a range of 0.03 to 200, in a range of 0.05 to 100, or in a range of 0.1 to 50.

From the viewpoint that two emission spectra can be clearly confirmed, a mixture in which the compounding ratio between the compound (1) and the compound (2) is in the above-described range is preferable.

In a case where the indium compound or cadmium compound (2) in the mixture according to the present embodiment is an indium compound, the molar ratio [(indium)/(B)] between the metal ion of the component B in the perovskite compound and the indium element of the indium compound may be in a range of 0.01 to 200, in a range of 0.1 to 100, or in a range of 2 to 70.

From the viewpoint that two emission spectra can be clearly confirmed, a mixture in which the compounding ratio between the compound (1) and the compound (2) is in the above-described range is preferable.

In the mixture according to the embodiment which contains the compound (1), the compound (2), and at least one of the solvent (3), and the polymerizable compound or polymer (4), the compounding ratio between the compound (1), and the solvent (3) and/or the polymerizable compound or polymer (4) may be at the level where the compound (1) satisfactorily exhibits the function of emitting light and can be appropriately determined depending on the kind and the like of the compound (1), the compound (2), the solvent (3), or the polymerizable compound or polymer (4).

In the mixture according to the embodiment which contains the compound (1), the compound (2), and at least one of the solvent (3), or the polymerizable compound or polymer (4), the mass ratio [(1)/(any one or both of (3) and (4))] between the compound (1), and any one or both of the solvent (3) and the polymerizable compound or polymer (4) may be in a range of 0.00001 to 10, in a range of 0.0001 to 1, or in a range of 0.0005 to 0.1.

From the viewpoints of making the compound (1) difficult to aggregate and satisfactorily exhibiting the light-emitting property, a mixture in which the compounding ratio between the compound (1), and any one or both of the solvent (3) and the polymerizable compound or polymer (4) is in the above-described range is preferable.

The combination of emission spectra of the compound (1) and the compound (2) in the mixture according to the present embodiment may be at the level where two emission peaks can be confirmed and can be appropriately determined depending on the kind of the halide ion of the component X in the compound (1) and the particle diameter and the like of the compound (2).

For example, an absolute value of a difference between the wavelengths of two emission peaks to be confirmed is preferably 30 nm or greater, more preferably 50 nm or greater, and still more preferably 100 nm or greater. Further, the minimum emission intensity in the wavelength range between two emission peaks is preferably 80% or less, more preferably 50% or less, and still more preferably 30% or less of the emission intensity of a higher emission peak between two emission peaks.

In the mixture according to the embodiment in which the absolute value of the difference between the wavelengths of two emission peaks is 30 nm or greater and the minimum emission intensity in the wavelength range between two emission peaks is 80% or less of the emission intensity of a higher emission peak between two emission peaks, for example, in a case where the halide ion of the component X in the perovskite compound (1) is a bromide ion and the indium compound or cadmium compound (2) is an indium compound, the average particle diameter of the indium compound is preferably 1 nm or greater and less than 2 nm or 3 nm or greater and more preferably 3 nm or greater.

According to another aspect of the present invention, the average particle diameter of the indium compound is preferably in a range of 3 nm to 10 nm.

In the mixture according to the embodiment in which the absolute value of the difference between the wavelengths of two emission peaks is 30 nm or greater and the minimum emission intensity in the wavelength range between two emission peaks is 80% or less of the emission intensity of a higher emission peak between two emission peaks, for example, in a case where the halide ion of the component X in the perovskite compound (1) is a bromide ion and the indium compound or cadmium compound (2) is a cadmium compound, the average particle diameter of the cadmium compound is preferably 1 nm or greater and less than 3 nm or 6 nm or greater and more preferably 6 nm or greater.

According to another aspect of the present invention, the average particle diameter of the cadmium compound is preferably in a range of 6 nm to 20 nm.

In the mixture according to the embodiment in which the absolute value of the difference between the wavelengths of two emission peaks is 30 nm or greater and the minimum emission intensity in the wavelength range between two emission peaks is 80% or less of the emission intensity of a higher emission peak between two emission peaks, for example, in a case where the halide ions of the component X in the perovskite compound (1) include iodide ions and the indium compound or cadmium compound (2) is an indium compound, the average particle diameter of the indium compound is preferably 1 nm or greater and less than 3 nm and more preferably 2 nm or greater and less than 3 nm.

In the mixture according to the embodiment in which the absolute value of the difference between the wavelengths of two emission peaks is 30 nm or greater and the minimum emission intensity in the wavelength range between two emission peaks is 80% or less of the emission intensity of a higher emission peak between two emission peaks, for example, in a case where the halide ions of the component X in the perovskite compound (1) include iodide ions and the indium compound or cadmium compound (2) is a cadmium compound, the average particle diameter of the cadmium compound is preferably 1 nm or greater and less than 6 nm and more preferably 3 nm or greater and less than 6 nm.

In the mixture according to the embodiment in which the absolute value of the difference between the wavelengths of two emission peaks is 50 nm or greater and the minimum emission intensity in the wavelength range between two emission peaks is 50% or less of the emission intensity of a higher emission peak between two emission peaks, for example, in a case where the halide ion of the component X in the perovskite compound (1) is a bromide ion and the indium compound or cadmium compound (2) is an indium compound, the average particle diameter of the indium compound is preferably 1 nm or greater and less than 1.8 nm or 3.2 nm or greater and more preferably 3.2 nm or greater.

According to another aspect of the present invention, the average particle diameter of the indium compound is preferably in a range of 3.2 nm to 10 nm.

In the mixture according to the embodiment in which the absolute value of the difference between the wavelengths of two emission peaks is 50 nm or greater and the minimum emission intensity in the wavelength range between two emission peaks is 50% or less of the emission intensity of a higher emission peak between two emission peaks, for example, in a case where the halide ion of the component X in the perovskite compound (1) is a bromide ion and the indium compound or cadmium compound (2) is a cadmium compound, the average particle diameter of the cadmium compound is preferably 1 nm or greater and less than 2.3 nm or 6.3 nm or greater and more preferably 6.3 nm or greater.

According to another aspect of the present invention, the average particle diameter of the cadmium compound is preferably in a range of 6.3 nm to 20 nm.

In the mixture according to the embodiment in which the absolute value of the difference between the wavelengths of two emission peaks is 50 nm or greater and the minimum emission intensity in the wavelength range between two emission peaks is 50% or less of the emission intensity of a higher emission peak between two emission peaks, for example, in a case where the halide ions of the component X in the perovskite compound (1) include iodide ions and the indium compound or cadmium compound (2) is an indium compound, the average particle diameter of the indium compound is preferably 1 nm or greater and less than 2.8 nm and more preferably 2 nm or greater and less than 2.8 nm.

In the mixture according to the embodiment in which the absolute value of the difference between the wavelengths of two emission peaks is 50 nm or greater and the minimum emission intensity in the wavelength range between two emission peaks is 50% or less of the emission intensity of a higher emission peak between two emission peaks, for example, in a case where the halide ions of the component X in the perovskite compound (1) include iodide ions and the indium compound or cadmium compound (2) is a cadmium compound, the average particle diameter of the cadmium compound is preferably 1 nm or greater and less than 5.7 nm and more preferably 3 nm or greater and less than 5.7 nm.

In the mixture according to the embodiment in which the absolute value of the difference between the wavelengths of two emission peaks is 100 nm or greater and the minimum emission intensity in the wavelength range between two emission peaks is 30% or less of the emission intensity of a higher emission peak between two emission peaks, for example, in a case where the halide ion of the component X in the perovskite compound (1) is a bromide ion and the indium compound or cadmium compound (2) is an indium compound, the average particle diameter of the indium compound is preferably 1 nm or greater and less than 1.7 nm or 3.3 nm or greater and more preferably 3.3 nm or greater.

According to another aspect of the present invention, the average particle diameter of the indium compound is preferably in a range of 3.3 nm to 10 nm.

In the mixture according to the embodiment in which the absolute value of the difference between the wavelengths of two emission peaks is 100 nm or greater and the minimum emission intensity in the wavelength range between two emission peaks is 30% or less of the emission intensity of a higher emission peak between two emission peaks, for example, in a case where the halide ion of the component X in the perovskite compound (1) is a bromide ion and the indium compound or cadmium compound (2) is a cadmium compound, the average particle diameter of the cadmium compound is preferably 1 nm or greater and less than 2.4 nm or 6.4 nm or greater and more preferably 6.4 nm or greater.

According to another aspect of the present invention, the average particle diameter of the cadmium compound is preferably in a range of 6.4 nm to 20 nm.

In the mixture according to the embodiment in which the absolute value of the difference between the wavelengths of two emission peaks is 100 nm or greater and the minimum emission intensity in the wavelength range between two emission peaks is 30% or less of the emission intensity of a higher emission peak between two emission peaks, for example, in a case where the halide ions of the component X in the perovskite compound (1) include iodide ions and the indium compound or cadmium compound (2) is an indium compound, the average particle diameter of the indium compound is preferably 1 nm or greater and less than 2.7 nm and more preferably 2 nm or greater and less than 2.7 nm.

In the mixture according to the embodiment in which the absolute value of the difference between the wavelengths of two emission peaks is 100 nm or greater and the minimum emission intensity in the wavelength range between two emission peaks is 30% or less of the emission intensity of a higher emission peak between two emission peaks, for example, in a case where the halide ions of the component X in the perovskite compound (1) include iodide ions and the indium compound or cadmium compound (2) is a cadmium compound, the average particle diameter of the cadmium compound is preferably 1 nm or greater and less than 5.6 nm and more preferably 3 nm or greater and less than 5.6 nm.

<Film>

A film according to the present invention is a film formed of the mixture which contains the perovskite compound (1), the indium compound or cadmium compound (2), and the polymer (4') and in which the total content ratio of the perovskite compound (1), the indium compound or cadmium compound (2), and the polymer (4') is 90% by mass or greater with respect to the total mass of the mixture. The mixture may contain at least one compound (5) selected from the group consisting of ammonia, an amine, a carboxylic acid, and salts or ions thereof.

The shape of the film is not particularly limited, and the film can be formed in a sheet shape or a bar shape. In the present specification, the "bar shape" indicates a shape having an anisotropy. As the shape having an anisotropy, a shape of a plate having sides with different lengths is an exemplary example.

The thickness of the film may be in a range of 0.01 μm to 1000 mm, in a range of 0.1 μm to 10 mm, or in a range of 1 μm to 1 mm.

The thickness of the film in the present specification can be obtained by measuring the thicknesses of the film at optional three points using a micrometer and calculating the average value of the measured values.

The film may be formed of a single layer or a plurality of layers. In a case of a plurality of layers, the same kind of mixture according to the embodiment may be used for each layer or different kinds of mixture according to the embodiment may be used for each layer.

The film can be obtained as a film formed on a substrate according to a method (i) to (iV) of producing a laminated structure described below. Further, the film can be obtained by being peeled off from the substrate.

<Laminated Structure>

The laminated structure according to the present invention has a plurality of layers, and at least one layer is the above-described film.

Among the plurality of layers included in the laminated structure, examples of layers other than the above-described film include optional layers such as a substrate, a barrier layer, and a light scattering layer.

The shape of the film to be laminated is not particularly limited, and the film can be formed in an optional shape such as a sheet shape or a bar shape.

(Substrate)

The layer which may be included in the laminated structure according to the present invention is not particularly limited, and examples thereof include a substrate. The substrate is not particularly limited and may be a film.

From the viewpoint of extracting light at the time of light emission, a transparent substrate is preferable. As the substrate, plastics such as polyethylene terephthalate or known materials such as glass can be used.

For example, the above-described film may be provided on the substrate in the laminated structure.

FIG. 1 is a cross-sectional view schematically showing the configuration of the laminated structure according to the present embodiment. A film 10 according to the present embodiment may be provided between a first substrate 20 and a second substrate 21 in a first laminated structure 1a. The film 10 is sealed by a sealing layer 22.

According to one aspect of the present invention, the laminated structure 1a includes the first substrate 20, the second substrate 21, the film 10 according to the present embodiment which is positioned between the first substrate 20 and the second substrate 21, and the sealing layer 22 and is configured such that the sealing layer is disposed on a surface that does not contact with the first substrate 20 and the second substrate 21 of the film 10.

(Barrier Layer)

The layer which may be included in the laminated structure according to the present invention is not particularly limited, and examples thereof include a barrier layer. The laminated structure may include a barrier layer because the barrier layer protects the above-described mixture from water vapor in outside air or the air in the atmosphere.

The barrier layer is not particularly limited, and a transparent barrier layer is preferable from the viewpoint of extracting emitted light. For example, a polymer such as polyethylene terephthalate or a known barrier layer such as a glass film can be employed.

(Light Scattering Layer)

The layer which can be included in the laminated structure according to the present invention is not particularly limited, and examples thereof include a light scattering layer. From the viewpoint of efficiently absorbing incident light, the laminated structure may include a light scattering layer.

The light scattering layer is not particularly limited, and a transparent light scattering layer is preferable from the viewpoint of extracting emitted light. For example, light scattering particles such as silica particles or a known light scattering layer such as an amplified diffusion film can be employed.

<Light-Emitting Device>

A light-emitting device according to the present invention can be obtained by combining the mixture according to the embodiment of the present invention or the laminated structure described above with a light source. The light-emitting device is a device that extracts light by irradiating the laminated structure or the mixture placed on the back stage with light emitted from the light source and allowing the mixture or the laminated structure to emit light. The laminated structure in the light-emitting device may include layers such as a reflective film, a diffusion film, a brightness-reinforcing film, a prism sheet, a light-guiding plate, and a medium material layer between elements.

According to one aspect of the present invention, a light-emitting device 2 is formed by laminating a prism sheet 50, a light-guiding plate 60, the first laminated structure 1*a*, and a light source 30 in this order.

(Light Source)

The light source constituting the light-emitting device according to the present invention is not particularly limited. However, from the viewpoint of allowing the compound (1) and the compound (2) in the mixture or the laminated structure to emit light, a light source having an emission wavelength of 600 nm or less is preferable, and examples thereof include known light sources, for example, a light-emitting diode (LED) such as a blue light-emitting diode, a laser, and an EL.

(Reflective Film)

The light-emitting device according to the present invention is not particularly limited and may include a light reflection member for irradiating the mixture or the laminated structure with light from the light source.

The reflective film is not particularly limited and may contain suitable optional known materials such as a reflecting mirror, a reflective particle film, a reflective metal film, and a reflector.

(Diffusion Film)

The light-emitting device according to the present invention is not particularly limited and may include a diffusion film for diffusing light emitted from the light source or light emitted from the mixture. Examples of the diffusion film include optional diffusion films known in the technical field such as an amplified diffusion film.

(Brightness-Reinforcing Unit)

The light-emitting device according to the present invention is not particularly limited and may include a brightness-reinforcing unit that reflects partial light to be returned to the direction in which the light is transmitted.

(Prism Sheet)

A prism sheet typically includes a base material portion and a prism portion. Further, the base material portion may not be provided depending on a member adjacent to the base material portion. The prism sheet is obtained by being bonded to a member adjacent thereto through an optional appropriate adhesion layer (for example, an adhesive layer or a pressure sensitive adhesive layer). The prism sheet is configured such that a plurality of unit prisms which become projections are arranged in parallel with one another on a side (rear side) opposite to a viewing side. Light transmitted through the prism sheet is likely to be focused by arranging the projections of the prism sheet toward the rear side. Further, in a case where the projections of the prism sheet are arranged toward the rear side, the quantity of light to be reflected without being incident on the prism sheet is small compared to a case where the projections are arranged toward the viewing side, and a display with high brightness can be obtained.

(Light-Guiding Plate)

As the light-guiding plate, an optional appropriate light-guiding plate can be used. For example, a light-guiding plate in which a lens pattern is formed on the rear side such that light from the lateral direction can be deflected in the thickness direction or a light-guiding plate in which a prism shape or the like is formed on the rear side and/or the viewing side is used.

(Medium Material Layer Between Elements)

The light-emitting device according to the present invention is not particularly limited and may include a layer formed of one or more medium materials on an optical path between elements (layers) adjacent to each other. Examples of one or more mediums include vacuum, air, gas, an optical material, an adhesive, an optical adhesive, glass, a polymer, a solid, a liquid, a gel, a curing material, an optical bonding material, a refractive index matching or refractive index mismatching material, a refractive index gradient material, a cladding or anti-gladding material, a spacer, a silica gel, a brightness-reinforcing material, a scattering or diffusing material, a reflective or anti-reflective material, a wavelength selective material, a wavelength selective anti-reflective material, a color filter, and other suitable media known in the technical field. However, the present invention is not limited to these, and optional suitable materials may be employed.

Specific examples of the light-emitting device according to the present invention include those provided with wavelength conversion materials for an EL display and a liquid crystal display.

Specific examples thereof include a backlight (E1) (on-edge type backlight) that converts blue light to green light or red light by putting the mixture of the present invention into a glass tube or the like so as to be sealed and disposing the glass tube or the like between a light-guiding plate and a blue light-emitting diode serving as a light source such that the glass tube or the like is along with an end surface (side surface) of the light-guiding plate; a backlight (E2) (surface-mounting type backlight) that converts blue light to be applied to a sheet after passing through a light-guiding plate from a blue light-emitting diode placed on an end surface (side surface) of the light-guiding plate to green light or red light by forming the sheet using the mixture of the present invention and placing a film obtained by interposing the sheet between two barrier films so as to be sealed on the light-guiding plate; a backlight (E3) (on-chip type backlight) that converts blue light to be applied to green light or red light by dispersing the mixture of the present invention in a resin or the like and placing the resin or the like in the vicinity of a light-emitting unit of a blue light-emitting diode; and a backlight (E4) that converts blue light to be applied from a light source to green light or red light by dispersing the mixture of the present invention in a resist and placing the resist on a color filter.

Further, specific examples of the light-emitting device according to the present invention include an illumination emitting white light which is obtained by forming the mixture according to the embodiment of the present invention, disposing the mixture on a back stage of a blue light-emitting diode serving as a light source, and converting blue light to green light or red light.

<Display>

Figure 2:
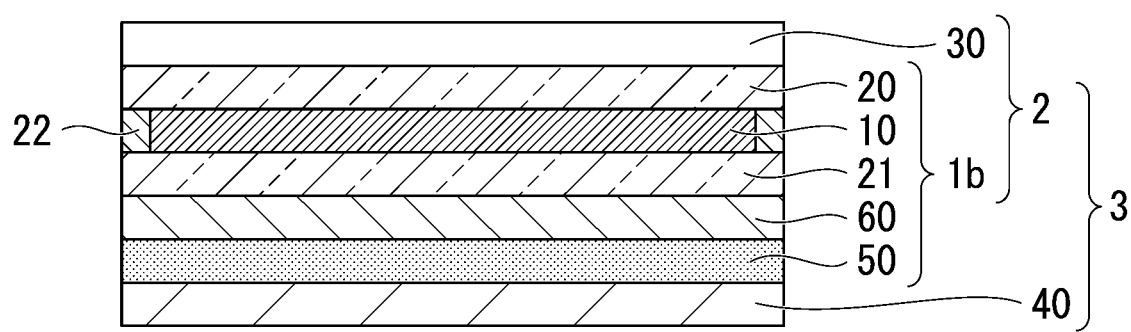
FIG. 2 is a cross-sectional view showing an embodiment of a display according to the present invention.

As shown in FIG. 2, a display 3 according to the present embodiment includes a liquid crystal panel 40 and the light-emitting device 2 described above in this order from the viewing side. The light-emitting device 2 includes a second laminated structure 1*b* and a light source 30. The second laminated structure 1*b* is formed of the first laminated structure 1*a* which further includes a prism sheet 50 and a light-guiding plate 60. A light crystal panel typically includes a liquid crystal cell; a viewing-side polarizing plate disposed on a viewing side of the liquid crystal cell; and a rear-surface-side polarizing plate disposed on a rear surface side of the liquid crystal cell. The display may further include other appropriate optional members.

According to one aspect of the present invention, the display is the liquid crystal display 3 obtained by laminating the liquid crystal panel 40, the prism sheet 50, the light-guiding plate 60, the first laminated structure 1*a*, and the light source 30 in this order.

<Liquid Crystal Panel>

The liquid crystal panel typically includes a liquid crystal cell; a viewing-side polarizing plate disposed on a viewing side of the liquid crystal cell; and a rear-surface-side polarizing plate disposed on a rear surface side of the liquid crystal cell.

The viewing-side polarizing plate and the rear-surface-side polarizing plate can be disposed such that respective absorption axes are substantially orthogonal or parallel to each other.

(Liquid Crystal Cell)

The liquid crystal cell includes a pair of substrates; and a liquid crystal layer serving as a display medium interposed between the substrates. In a typical configuration, a color filter and a black matrix are provided on one substrate. Further, a switching element that controls electro-optical characteristics of a liquid crystal; a scanning line that sends a gate signal to the switching element and a signal line that sends a source signal to the switching element; and a pixel electrode and a counter electrode are provided on the other substrate. The interval (cell gap) between the substrates can be controlled by a spacer or the like. For example, an alignment film formed of polyimide can be provided on a side of the substrate contact in the liquid crystal layer.

(Polarizing Plate)

The polarizing plate typically includes a polarizer; and a protective layer disposed on both sides of the polarizer. Typically, the polarizer is an absorption type polarizer.

As the polarizer, an appropriate optional polarizer is used. Examples thereof include a polarizer obtained by adsorbing a dichroic material such as iodine or a dichroic dye on a hydrophilic polymer such as a polyvinyl alcohol-based film, a partially formalized polyvinyl alcohol-based film, or an ethylene-vinyl acetate copolymer-based partially saponified film so as to be uniaxially stretched; and a polyene-based alignment film such as a dehydrated product of polyvinyl alcohol or a dehydrochlorinated product of polyvinyl chloride. Among these, a polarizer obtained by adsorbing a dichroic material such as iodine on a polyvinyl alcohol-based film so as to be uniaxially stretched is particularly preferable from the viewpoint of a high dichroic ratio.

As the applications of the mixture according to the present invention, a wavelength conversion material for a laser diode is an exemplary example.

<LED>

The mixture according to the present invention can be used as a material for a light-emitting layer of an LED.

As the LED containing the mixture of the present invention, an LED which has a structure in which the mixture of the present invention and conductive particles such as ZnS are mixed and laminated in a film shape, an n-type transport layer is laminated on one surface, and a p-type transport layer is laminated on the other surface and emits light by circulating the current so that positive holes of a p-type semiconductor and electrons of an n-type semiconductor cancel the charge in the particles in the compound (1) and the compound (2) contained in the bonding surface of the mixture is an exemplary example.

<Solar Cell>

The mixture of the present invention can be used as an electron transport material contained in an active layer of a solar cell.

The configuration of the solar cell is not particularly limited, and examples thereof include a solar cell which includes a fluorine-doped tin oxide (FTO) substrate, a titanium oxide dense layer, a porous aluminum oxide layer, an active layer containing the mixture of the present invention, a hole transport layer such as 2,2',7,7'-tetrakis-(N,N'-di-p-methoxyphenylamine)-9,9'-spirobifluorene (Spiro-OMeTAD), and a silver (Ag) electrode in this order.

The titanium oxide dense layer has a function of transporting electrons, an effect of suppressing the roughness of FTO, and a function of suppressing movement of inverse electrons.

The porous aluminum oxide layer has a function of improving the light absorption efficiency.

The mixture of the present invention which is contained in the active layer plays a role of charge separation and electron transport.

<Method of Producing Mixture>

Hereinafter, a method of producing the mixture will be described based on the embodiments. According to the production method, the mixture according to the embodiment of the present invention can be produced. Further, the mixture of the present invention is not limited to a mixture produced by a method of producing a mixture according to the embodiment described below.

Method of Producing Perovskite Compound (1)

The perovskite compound according to the present invention can be produced according to a method of a first embodiment or a second embodiment described below with reference to, for example, the known literature (Nano Lett. 2015, 15, 3692 to 3696, ACSNano, 2015, 9, 4533 to 4542).

Further, the perovskite compound (1) containing at least one compound (5) selected from the group consisting of ammonia, an amine, a carboxylic acid, and salts or ions thereof may be produced by adding the compound (5) in the first embodiment or in any step included in the first embodiment described below or produced by mixing the obtained perovskite compound (1) with the compound (5).

From the viewpoint of improving the dispersibility of the perovskite compound (1) and the compound (2), it is preferable that the perovskite compound (1) is produced by adding the compound (5) in any step included in the method of producing the perovskite compound (1).

(First Embodiment of Method of Producing Perovskite Compound)

Examples of the method of producing the perovskite compound according to the present invention include a production method including a step of dissolving the component B, the component X, and the component A in a solvent; and a step of mixing the obtained solution with a solvent in which the solubility of the perovskite compound therein is lower than that of the solvent used in the step of obtaining the solution.

More specific examples thereof include a production method including a step of dissolving a compound that contains the component B and the component X and a compound that contains the component A or the component A and the component X in a solvent to obtain a solution; and a step of mixing the obtained solution with a solvent in which the solubility of the perovskite compound therein is lower than that of the solvent used in the step of obtaining the solution.

Hereinafter, the production method including a step of dissolving a compound that contains the component B and the component X and a compound that contains the component A or the component A and the component X in a solvent to obtain a solution; and a step of mixing the obtained solution with a solvent in which the solubility of the perovskite compound therein is lower than that of the solvent used in the step of obtaining the solution will be described.

Further, the solubility indicates the solubility at the temperature of carrying out the mixing step.

From the viewpoint of stably dispersing the perovskite compound, it is preferable that the production method includes a step of adding capping ligands.

It is preferable that the capping ligands are added before the mixing step is carried out. The capping ligands may be added to the solution in which the component A, the component B, and the component X are dissolved; the solvent in which the solubility of the perovskite compound therein is lower than that of the solvent used in the step of obtaining the solution; or both of the solution in which the component A, the component B, and the component X are dissolved and the solvent in which the solubility of the perovskite compound therein is lower than that of the solvent used in the step of obtaining the solution.

It is preferable that the production method includes a step of removing coarse particles using a method of carrying out centrifugation or filtration after the mixing step described above. The size of the coarse particles to be removed by the removal step is preferably 10 µm or greater, more preferably 1 µm or greater, and still more preferably 500 nm or greater.

The step of mixing the obtained solution with the solvent in which the solubility of the perovskite compound therein is lower than that of the solvent used in the step of obtaining the solution may be a step (I) of adding the solution dropwise to the solvent in which the solubility of the perovskite compound therein is lower than that of the solvent used in the step of obtaining the solution or a step (II) of adding the solvent, in which the solubility of the perovskite compound therein is lower than that of the solvent used in the step of obtaining the solution, dropwise to the solution. However, from the viewpoint of improving the dispersibility, the step (I) is preferable.

It is preferable that stirring is performed during dropwise addition from the viewpoint of improving the dispersibility.

In the step of mixing the solution with the solvent in which the solubility of the perovskite compound therein is lower than that of the solvent used in the step of obtaining the solution, the temperature is not particularly limited, but is preferably in a range of −20° C. to 40° C. and more preferably in a range of −5° C. to 30° C. from the viewpoint that the perovskite compound is easily precipitated.

Two kinds of solvents with different solubilities in the solvent of the perovskite compound used in the production method are not particularly limited, and examples thereof include two solvents selected from the group consisting of alcohols such as methanol, ethanol, 1-propanol, 2-propanol, 1-butanol, 2-butanol, tert-butanol, 1-pentanol, 2-methyl-2-butanol, methoxypropanol, diacetone alcohol, cyclohexanol, 2-fluoroethanol, 2,2,2-trifluoroethanol, and 2,2,3,3-tetrafluoro-1-propanol; a glycol ether such as ethylene glycol monomethyl ether, ethylene glycol monoethyl ether, ethylene glycol monobutyl ether, ethylene glycol monoethyl ether acetate, or triethylene glycol dimethyl ether; an organic solvent containing an amide group such as N,N-dimethylformamide, acetamide, or N,N-dimethylacetamide; an ester such as dimethyl sulfoxide, methyl formate, ethyl formate, propyl formate, pentyl formate, methyl acetate, ethyl acetate, or pentyl acetate; a ketone such as γ-butyrolactone, N-methyl-2-pyrrolidone, acetone, dimethyl ketone, diisobutyl ketone, cyclopentanone, cyclohexanone, or methyl cyclohexanone; an ether such as diethyl ether, methyl-tert-butyl ether, diisopropyl ether, dimethoxymethane, dimethoxyethane, 1,4-dioxane, 1,3-dioxolane, 4-methyldioxolane, tetrahydrofuran, methyl tetrahydrofuran, anisole, or phenetole; an organic solvent containing a nitrile group such as acetonitrile, isobutyronitrile, propionitrile, or methoxy acetonitrile; an organic solvent containing a carbonate group such as ethylene carbonate or propylene carbonate; an organic solvent containing a halogenated hydrocarbon group such as methylene chloride or chloroform; and an organic solvent containing a hydrocarbon group such as n-pentane, cyclohexane, n-hexane, benzene, toluene, or xylene.

As the solvent used in the step of obtaining the solution which is included in the production method, a solvent with a higher solubility in the solvent of the perovskite compound is preferable, and examples thereof include, in a case where the step is performed at room temperature (10° C. to 30° C.), alcohols such as methanol, ethanol, 1-propanol, 2-propanol, 1-butanol, 2-butanol, tert-butanol, 1-pentanol, 2-methyl-2-butanol, methoxypropanol, diacetone alcohol, cyclohexanol, 2-fluoroethanol, 2,2,2-trifluoroethanol, and 2,2,3,3-tetrafluoro-1-propanol; a glycol ether such as ethylene glycol monomethyl ether, ethylene glycol monoethyl ether, ethylene glycol monobutyl ether, ethylene glycol monoethyl ether acetate, or triethylene glycol dimethyl ether; an organic solvent containing an amide group such as N,N-dimethylformamide, acetamide, or N,N-dimethylacetamide; and dimethyl sulfoxide.

As the solvent used in the mixing step which is included in the production method, a solvent with a lower solubility in the solvent of the perovskite compound is preferable, and examples thereof include, in a case where the step is performed at room temperature (10° C. to 30° C.), an ester such as methyl formate, ethyl formate, propyl formate, pentyl formate, methyl acetate, ethyl acetate, or pentyl acetate; a ketone such as γ-butyrolactone, N-methyl-2-pyrrolidone, acetone, dimethyl ketone, diisobutyl ketone, cyclopentanone, cyclohexanone, or methyl cyclohexanone; an ether such as diethyl ether, methyl-tert-butyl ether, diisopropyl ether, dimethoxymethane, dimethoxyethane, 1,4-dioxane, 1,3-dioxolane, 4-methyldioxolane, tetrahydrofuran, methyl tetrahydrofuran, anisole, or phenetole; an organic solvent containing a nitrile group such as acetonitrile, isobutyronitrile, propionitrile, or methoxy acetonitrile; an organic solvent containing a carbonate group such as ethylene carbonate or propylene carbonate; an organic solvent containing a halogenated hydrocarbon group such as methylene chloride or chloroform; and an organic solvent containing a hydrocarbon group such as n-pentane, cyclohexane, n-hexane, benzene, toluene, or xylene.

A difference in solubility between two kinds of solvents with different solubilities is preferably in a range of (100 µg/100 g of solvent) to (90 g/100 g of solvent) and more preferably in a range of (1 mg/100 g of solvent) to (90 g/100 g of solvent). From the viewpoint of adjusting the difference in solubility to be in a range of (100 µg/100 g of solvent) to (90 g/100 g of solvent), for example, in a case where the mixing step is performed at room temperature (10° C. to 30° C.), it is preferable that the solvent used in the step of obtaining the solution is an organic solvent containing an amide group such as N,N-dimethylacetamide or dimethyl sulfoxide, and the solvent used in the mixing step is an organic solvent containing a halogenated hydrocarbon group such as methylene chloride or chloroform or an organic solvent containing a hydrocarbon group such as n-pentane, cyclohexane, n-hexane, benzene, toluene, or xylene.

In a case where the perovskite compound is extracted from the obtained dispersion liquid containing the perovskite compound, it is possible to recover only the perovskite compound by performing solid-liquid separation.

Examples of the above-described solid-liquid separation method include a method of performing filtration or the like and a method of using evaporation of a solvent.

(Second Embodiment of Method of Producing Perovskite Compound)

The method of producing the perovskite compound may be a production method including a step of adding the component B, the component X, and the component A to a solvent at a high temperature and dissolving the components therein to obtain a solution; and a step of cooling the obtained solution.

More specifically, a production method including a step of adding a compound containing the component B and the component X and a compound containing the component A or the component A and the component X to a solvent at a high temperature and dissolving the components therein to obtain a solution; and a step of cooling the obtained solution is an exemplary example.

According to the production method, the perovskite compound according to the present invention can be produced by allowing the perovskite compound according to the present invention to precipitate based on the difference in solubility caused by the difference in temperature.

From the viewpoint of stably dispersing the perovskite compound, it is preferable that the production method includes a step of adding capping ligands.

It is preferable that the production method includes a step of removing coarse particles using a method of carrying out centrifugation or filtration after the cooling step. The size of the coarse particles to be removed by the removal step is preferably 10 µm or greater, more preferably 1 µm or greater, and still more preferably 500 nm or greater.

Here, the solvent at a high temperature may be a solvent at a temperature at which the compound containing the component B and the component X and the compound containing the component A or the component A and the component X are dissolved. For example, a solvent at 60° C. to 600° C. is preferable, and a solvent at 80° C. to 400° C. is more preferable.

The cooling temperature is preferably in a range of −20° C. to 50° C. and more preferably in a range of −10° C. to 30° C.

The cooling rate is preferably in a range of 0.1° C. to 1500° C./min and more preferably in a range of 10° C. to 150° C./min.

The solvent used in the production method is not particularly limited as long as the compound containing the component B and the component X and the compound containing the component A or the component A and the component X are dissolved in the solvent, and examples thereof include an ester such as methyl formate, ethyl formate, propyl formate, pentyl formate, methyl acetate, ethyl acetate, or pentyl acetate; a ketone such as γ-butyrolactone, N-methyl-2-pyrrolidone, acetone, dimethyl ketone, diisobutyl ketone, cyclopentanone, cyclohexanone, or methyl cyclohexanone; an ether such as diethyl ether, methyl-tert-butyl ether, diisopropyl ether, dimethoxymethane, dimethoxyethane, 1,4-dioxane, 1,3-dioxolane, 4-methyldioxolane, tetrahydrofuran, methyl tetrahydrofuran, anisole, or phenetole; an alcohol such as methanol, ethanol, 1-propanol, 2-propanol, 1-butanol, 2-butanol, tert-butanol, 1-pentanol, 2-methyl-2-butanol, methoxypropanol, diacetone alcohol, cyclohexanol, 2-fluoroethanol, 2,2,2-trifluoroethanol, or 2,2,3,3-tetrafluoro-1-propanol; a glycol ether such as ethylene glycol monomethyl ether, ethylene glycol monoethyl ether, ethylene glycol monobutyl ether, ethylene glycol monoethyl ether acetate, or triethylene glycol dimethyl ether; an organic solvent containing an amide group such as N,N-dimethylformamide, acetamide, or N,N-dimethylacetamide; an organic solvent containing a nitrile group such as acetonitrile, isobutyronitrile, propionitrile, or methoxy acetonitrile; an organic solvent containing a carbonate group such as ethylene carbonate or propylene carbonate; an organic solvent containing a halogenated hydrocarbon group such as methylene chloride or chloroform; an organic solvent containing a hydrocarbon group such as n-pentane, cyclohexane, n-hexane, benzene, toluene, or xylene; and dimethyl sulfoxide, and 1-octadecene.

Examples of the method of extracting the perovskite compound from the obtained dispersion liquid containing the perovskite compound include a method of recovering only the perovskite compound by performing solid-liquid separation.

Examples of the above-described solid-liquid separation method include a method of performing filtration or the like and a method of using evaporation of a solvent.

Method of Producing Indium Compound or Cadmium Compound (2)

The indium compound or cadmium compound may be produced according to a known production method or commercially available products may be used. Examples of the known production method include a method of heating a mixed solution obtained by mixing a single element, which constitutes the indium compound or cadmium compound, or a compound thereof and a lipophilic solvent.

The single element constituting the indium compound or cadmium compound or the compound thereof is not particularly limited, and examples thereof include a metal, an oxide, an acetate, an organic metal compound, a halide, and a nitrate.

Examples of the lipophilic solvent include a nitrogen-containing compound containing a hydrocarbon group having 4 to 20 carbon atoms; and an oxygen-containing compound containing a hydrocarbon group having 4 to 20 carbon atoms.

Examples of the hydrocarbon group having 4 to 20 carbon atoms include a saturated aliphatic hydrocarbon group such as an n-butyl group, an isobutyl group, an n-pentyl group, an octyl group, a decyl group, a dodecyl group, a hexadecyl group, or an octadecyl group; an unsaturated aliphatic hydrocarbon group such as an oleyl group; an alicyclic hydrocarbon group such as a cyclopentyl group or a cyclohexyl group; and an aromatic hydrocarbon group such as a phenyl group, a benzyl group, a naphthyl group, or a naphthylmethyl group. Among these, a saturated aliphatic hydrocarbon group or an unsaturated aliphatic hydrocarbon group is preferable.

Examples of the nitrogen-containing compound include amines and amides; and examples of the oxygen-containing compound include aliphatic acids.

Among such lipophilic solvents, a nitrogen-containing compound having hydrocarbon group having 4 to 20 carbon atoms is preferable, and examples thereof include an alkylamine such as n-butylamine, isobutylamine, n-pentylamine, n-hexylamine, octylamine, decylamine, dodecylamine, hexadecylamine, or octadecylamine; and an alkenylamine such as oleylamine. The lipophilic solvent can be bonded to the surface each particle in the formed compound (2), and examples of the bonding mode include chemical bonds such as a covalent bond, an ion bond, a coordination bond, a hydrogen bond, and a van der Waals bond.

The heating temperature of the mixed solution may be appropriately set depending on the kind of the single or compound to be used, but is preferably in a range of 130° C. to 300° C. and more preferably in a range of 240° C. to 300° C. From the viewpoint that the crystal structure of the obtained compound (2) is easily unified, it is preferable that the heating temperature is higher than or equal to the above-described lower limit. Further, the heating time may be appropriately set depending on the kind of the single or compound to be used and the heating temperature. However, typically, the heating time is preferably several seconds to several hours and more preferably in a range of 1 to 60 minutes.

According to the method of producing the indium compound or cadmium compound, the heated mixed solution is cooled to be separated into a supernatant and a precipitate, and the separated precipitate is put into an organic solvent (such as chloroform, toluene, hexane, or n-butanol) to obtain a solution containing the indium compound or cadmium compound. Alternatively, the heated mixed solution is cooled to be separated into a supernatant and a precipitate, a solvent (such as methanol, ethanol, acetone, or acetonitrile) in which nanoparticles are insoluble or sparingly soluble is added to the separated supernatant to generate a precipitate, the precipitate is collected and put into the above-described organic solvent to obtain a solution containing the indium compound or cadmium compound.

Method of Producing Mixture Containing Compound (1) and Compound (2) Examples of the method of producing the mixture containing the compound (1) and the compound (2) include a production method including a step (a) of mixing the perovskite compound (1) with the indium compound or cadmium compound (2).

It is preferable that stirring is performed during the mixing step from the viewpoint of uniformly mixing the compound (1) and the compound (2).

Method of Producing Mixture Containing Compound (1), Compound (2), and Solvent (3)

Examples of the method of producing the mixture containing the compound (1), the compound (2), and the solvent (3) include a production method (b) including a step of mixing the perovskite compound (1), the indium compound or cadmium compound (2), and the solvent (3).

It is preferable that stirring is performed during the mixing from the viewpoint of improving the dispersibility of the compound (1) and the compound (2).

In the mixing step, the temperature is not particularly limited, but is preferably in a range of 0° C. to 100° C. and more preferably in a range of 10° C. to 80° C. from the viewpoint of uniformly mixing the compounds.

The step (b) may be a step (b1) of mixing the perovskite compound (1) with the solvent (3) and mixing the mixture with the indium compound or cadmium compound (2) or a step (b2) of mixing the perovskite compound (1) with the indium compound or cadmium compound (2) and mixing the mixture with the solvent (3).

From the viewpoint of improving the dispersibility of the compound (1) and the compound (2), it is preferable that the step (b) is the step (b1).

Method of Producing Mixture Containing Compound (1), Compound (2), Solvent (3), and Compound (5)

The method of producing the mixture containing the compound (1), the compound (2), the solvent (3), and the compound (5) may be the same as the above-described method of producing the mixture containing the compound (1), the compound (2), and the solvent (3) except that at least one compound (5) selected from the group consisting of ammonia, an amine, a carboxylic acid, and salts or ions thereof is added.

The compound (5) may be added in any step included in the method of producing the perovskite compound (1) described above or may be added in any step included in the method of producing the mixture containing the compound (1), the compound (2), and the solvent (3) described above.

From the viewpoint of improving the dispersibility of the compound (1), it is preferable that the compound (5) is added in any step included in the method of producing the perovskite compound (1).

It is preferable that stirring is performed during the mixing from the viewpoint of improving the dispersibility of the compound (1) and the compound (2).

In the step of mixing the perovskite compound (1), the indium compound or cadmium compound (2), the solvent (3), and at least one compound (5) selected from the group consisting of ammonia, an amine, a carboxylic acid, and salts and ions thereof, the temperature is not particularly limited, but is preferably in a range of 0° C. to 100° C. and more preferably in a range of 10° C. to 80° C. from the viewpoint of uniformly mixing the compounds.

Method of Producing Mixture Containing Compound (1), Compound (2), and Polymerizable Compound or Polymer (4)

As the method of producing the mixture containing the compound (1), the compound (2), and the polymerizable compound or polymer (4), a production method including a step (c) of mixing the perovskite compound (1), the indium compound or cadmium compound (2), and the polymerizable compound or polymer (4) is an exemplary example.

From the viewpoint of improving the dispersibility of the perovskite compound (1), it is preferable that the step of mixing the perovskite compound (1), the indium compound or cadmium compound (2), and the polymerizable compound or polymer (4) is performed while being stirred.

In the mixing step, the temperature is not particularly limited, but is preferably in a range of 0° C. to 100° C. and more preferably in a range of 10° C. to 80° C. from the viewpoint of uniformly mixing the compounds.

The production method (c) may be a production method (c1) including a step of dispersing the perovskite compound (1) in the polymerizable compound or polymer (4) to obtain a dispersion and a step of mixing the obtained dispersion with the indium compound or cadmium compound (2), a production method (c2) including a step of dispersing the indium compound or cadmium compound (2) in the polymerizable compound or polymer (4) to obtain a dispersion and a step of mixing the obtained dispersion with the perovskite compound (1), a production method (c3) including a step of dispersing the perovskite compound (1) and the indium compound or cadmium compound (2) in the polymerizable compound or polymer (4), or a production method (c4) including a step of mixing the perovskite compound (1) with the solvent (3) to obtain a dispersion containing the perovskite compound (1), a step of mixing the indium compound or cadmium compound (2) with the solvent (3) to obtain a dispersion containing the indium compound or cadmium compound (2), and a step of mixing the polymerizable compound or polymer (4), the dispersion containing the perovskite compound (1), and the dispersion containing the indium compound or cadmium compound (2).

In the steps of obtaining each dispersion included in the production methods (c1) to (c3), the polymerizable compound or polymer (4) may be added dropwise to the compound (1) and/or the compound (2), or the compound (1) and/or the compound (2) may be added dropwise to the polymerizable compound or polymer (4).

From the viewpoint of improving the dispersibility, it is preferable that the compound (1) and/or the compound (2) is added dropwise to the polymerizable compound or polymer (4).

In the step of obtaining the dispersion included in the production method (c4), the solvent (3) may be added dropwise to the compound (1) or the compound (2), or the compound (1) or the compound (2) may be added dropwise to the solvent (3).

From the viewpoint of improving the dispersibility, it is preferable that the compound (1) or the compound (2) is added dropwise to the solvent (3).

In each mixing step included in the production methods (c1) and (c2), the compound (1) or the compound (2) may be added dropwise to the dispersion, or the dispersion may be added dropwise to the compound (1) or the compound (2).

From the viewpoint of improving the dispersibility, it is preferable that the compound (1) or the compound (2) is added dropwise to the dispersion.

In a case where a polymer is employed as the polymerizable compound or the polymer (4), the polymer may be a polymer in a state of being dissolved in a solvent.

The solvent in which the above-described polymer is dissolved is not particularly limited as long as the polymer (resin) can be dissolved in the solvent, but a solvent in which the compound (1) or the compound (2) according to the present invention is unlikely to be dissolved is preferable.

Examples of the solvent include an ester such as methyl formate, ethyl formate, propyl formate, pentyl formate, methyl acetate, ethyl acetate, or pentyl acetate; a ketone such as γ-butyrolactone, N-methyl-2-pyrrolidone, acetone, dimethyl ketone, diisobutyl ketone, cyclopentanone, cyclohexanone, or methyl cyclohexanone; an ether such as diethyl ether, methyl-tert-butyl ether, diisopropyl ether, dimethoxymethane, dimethoxyethane, 1,4-dioxane, 1,3-dioxolane, 4-methyldioxolane, tetrahydrofuran, methyl tetrahydrofuran, anisole, or phenetole; an alcohol such as methanol, ethanol, 1-propanol, 2-propanol, 1-butanol, 2-butanol, tert-butanol, 1-pentanol, 2-methyl-2-butanol, methoxypropanol, diacetone alcohol, cyclohexanol, 2-fluoroethanol, 2,2,2-trifluoroethanol, or 2,2,3,3-tetrafluoro-1-propanol; a glycol ether such as ethylene glycol monomethyl ether, ethylene glycol monoethyl ether, ethylene glycol monobutyl ether, ethylene glycol monoethyl ether acetate, or triethylene glycol dimethyl ether; an organic solvent containing an amide group such as N,N-dimethylformamide, acetamide or N,N-dimethylacetamide; an organic solvent containing a nitrile group such as acetonitrile, isobutyronitrile, propionitrile, or methoxy acetonitrile; an organic solvent containing a carbonate group such as ethylene carbonate or propylene carbonate; an organic solvent containing a halogenated hydrocarbon group such as methylene chloride or chloroform; an organic solvent containing a hydrocarbon group such as n-pentane, cyclohexane, n-hexane, benzene, toluene, or xylene; and dimethyl sulfoxide.

Among these, an ester such as methyl formate, ethyl formate, propyl formate, pentyl formate, methyl acetate, ethyl acetate, or pentyl acetate; a ketone such as γ-butyrolactone, acetone, dimethyl ketone, diisobutyl ketone, cyclopentanone, cyclohexanone, or methyl cyclohexanone; an ether such as diethyl ether, methyl-tert-butyl ether, diisopropyl ether, dimethoxymethane, dimethoxyethane, 1,4-dioxane, 1,3-dioxolane, 4-methyldioxolane, tetrahydrofuran, methyl tetrahydrofuran, anisole, or phenetole; an organic solvent containing a nitrile group such as acetonitrile, isobutyronitrile, propionitrile, or methoxyacetonitrile; an organic solvent containing a carbonate group such as ethylene carbonate or propylene carbonate; an organic solvent containing a halogenated hydrocarbon group such as methylene chloride or chloroform; or an organic solvent containing a hydrocarbon group such as n-pentane, cyclohexane, n-hexane, benzene, toluene, or xylene is preferable from the viewpoint that the polarity is low and the perovskite compound according to the present invention is unlikely to be dissolved therein, and an organic solvent containing a halogenated hydrocarbon group such as methylene chloride or chloroform; or an organic solvent containing a hydrocarbon group such as n-pentane, cyclohexane, n-hexane, benzene, toluene, or xylene is more preferable.

Method of Producing Mixture Containing Compound (1), Compound (2), Polymerizable Compound or Polymer (4), and Compound (5)

The method of producing the mixture containing the compound (1), the compound (2), the polymerizable compound or polymer (4), and the compound (5) may be the same as the above-described method of producing the mixture containing the compound (1), the compound (2), and the polymerizable compound or polymer (4) except that at least one compound (5) selected from the group consisting of ammonia, an amine, a carboxylic acid, and salts or ions thereof is added.

The compound (5) may be added in any step included in the method of producing the perovskite compound (1) described above or may be added in any step included in the method of producing the mixture containing the compound (1), the compound (2), and the polymerizable compound or polymer (4) described above.

From the viewpoint of improving the dispersibility of the compound (1), it is preferable that the compound (5) is added in any step included in the method of producing the perovskite compound (1).

In the method of producing the mixture containing the compound (1), the compound (2), the polymerizable compound or polymer (4), and the compound (5), the solvent (3) may be used. In this manner, for example, the mixture according to the present embodiment can be obtained as a mixture of a dispersion in which the compound (1) containing the compound (5) is dispersed in the solvent (3), a dispersion in which the compound (2) is dispersed in the solvent (3), and the polymerizable compound or polymer (4).

Method of Producing Mixture which Contains Compound (1), Compound (2), and Polymer (4') and in which Total Amount of Compound (1), Compound (2), and Polymer (4') is 90% by Mass or Greater Examples of the method of producing the mixture which contains the compound (1), the compound (2), and the polymer (4') and in which the total amount of the compound (1), the compound (2), and the polymer (4') is 90% by mass or greater include a production method including a step of mixing the perovskite compound (1), the indium compound or cadmium compound (2), and the polymerizable compound and a step of polymerizing the polymerizable compound; and a production method including a step of mixing the perovskite compound (1), the indium compound or cadmium compound (2) and the polymer dissolved in a solvent and a step of removing the solvent.

As the mixing step included in the production method, the same mixing method as the method of producing the mixture containing the compound (1), the compound (2), and the polymerizable compound or polymer (4) described above can be used.

The production method may be, for example, a production method (c1-1) including a step of dispersing the perovskite compound (1) in the polymerizable compound to obtain a dispersion, a step of mixing the obtained dispersion and the indium compound or cadmium compound (2), and a step of polymerizing the polymerizable compound; a production method (c1-2) including a step of dispersing the perovskite compound (1) in the polymer dissolved in a solvent to obtain a dispersion, a step of mixing the obtained dispersion and the indium compound or cadmium compound (2), and a step of removing the solvent; a production method (c2-1) including a step of dispersing the indium compound or cadmium compound (2) in the polymerizable compound to obtain a dispersion, a step of mixing the obtained dispersion with the perovskite compound (1), and a step of polymerizing the polymerizable compound; a production method (c2-2) including a step of dispersing the indium compound or cadmium compound (2) in the polymer dissolved in a solvent to obtain a dispersion, a step of mixing the obtained dispersion and the perovskite compound (1), and a step of removing the solvent; a production method (c3-1) including a step of dispersing the mixture of the perovskite compound (1) and the indium compound or cadmium compound (2) in the polymerizable compound and a step of polymerizing the polymerizable compound; a production method (c3-2) including a step of dispersing the mixture of the perovskite compound (1) and the indium compound or cadmium compound (2) in the polymer dissolved in a solvent and a step of removing the solvent; a production method (c4-1) including a step of mixing the perovskite compound (1) with the solvent (3) to obtain a dispersion containing the perovskite compound (1), a step of mixing the indium compound or cadmium compound (2) with the solvent (3) to obtain a dispersion containing the indium compound or cadmium compound (2), a step of mixing the polymerizable compound (4), the dispersion containing the perovskite compound (1), and the dispersion containing the indium compound or cadmium compound (2), and a step of removing the solvent; or a production method (c4-2) including a step of mixing the perovskite compound (1) with the solvent (3) to obtain a dispersion containing the perovskite compound (1), a step of mixing the indium compound or cadmium compound (2) with the solvent (3) to obtain a dispersion containing the indium compound (2), a step of mixing the polymer dissolved in a solvent, the dispersion containing the perovskite compound (1), and the dispersion containing the indium compound or cadmium compound (2), and a step of polymerizing the polymerizable compound.

The step of removing the solvent included in the production method may be a step of allowing the solvent to stand at room temperature so as to be naturally dried or a step of evaporating the solvent by being heated or dried under reduced pressure using a vacuum dryer.

For example, the solvent can be removed by being dried in a temperature range of 0° C. to 300° C. for 1 minute to 7 days.

The step of polymerizing the polymerizable compound included in the production method can be performed by appropriately using a known polymerization reaction such as radical polymerization.

For example, in a case of the radical polymerization, the polymerization reaction can be allowed to proceed by adding a radical polymerization initiator to the mixture of the perovskite compound (1), the indium compound or cadmium compound (2), and the polymerizable compound to generate a radical.

The radical polymerization initiator is not particularly limited, and examples thereof include a photoradical polymerization initiator.

As the photoradical polymerization initiator, bis(2,4,6-trimethylbenzoyl)-phenylphosphine oxide is exemplary example.

Method of Producing Mixture which Contains Compound (1), Compound (2), Compound (5), and Polymer (4') and in which Total Amount of Compound (1), Compound (2), Compound (5), and Polymer (4') is 90% by Mass or Greater with Respect to Total Mass of Mixture The method of producing the mixture which contains the compound (1), the compound (2), the compound (5), and the polymer (4') and in which the total amount of the compound (1), the compound (2), the compound (5), and the polymer (4') is 90% by mass or greater with respect to the total mass of the mixture may be the same as the above-described method of producing the mixture which contains the compound (1), the compound (2), and the polymer (4') and in which the total amount of the compound (1), the compound (2), and the polymer (4') is 90% by mass or greater with respect to the total mass of the mixture except that at least one compound (5) selected from the group consisting of ammonia, an amine, a carboxylic acid, and salts or ions thereof is added.

The compound (5) may be added in any step included in the method of producing the perovskite compound (1) described above or may be added in any step included in the method of producing the mixture containing the compound (1), the compound (2), and the polymer (4') described above.

From the viewpoint of improving the dispersibility of the compound (1), it is preferable that the compound (5) is added in any step included in the method of producing the perovskite compound (1).

<<Measurement of Concentration of Constituent Components in Perovskite Compound and Concentration of Perovskite Compound Based on Measured Concentration of Constituent Components>>

The concentration (μg/g) of the constituent components in the perovskite compound with respect to the total mass of the mixture according to the present invention is acquired by measuring the component A and the component B such as Pb and Cs using an inductively coupled plasma spectrometer ICP-MS (for example, ELAN DRCII, manufactured by PerkinElmer, Inc.) and measuring the component X such as Br using ion chromatography (for example, Intergrion, manufactured by ThermoFisher Scientific Inc.). The concentration of the perovskite compound is acquired from the total amount of each of the above-described constituent components.

The measurement of each component is performed using a solvent containing the perovskite compound and a good solvent such as N,N-dimethylformamide.

<<Measurement of Concentration of Constituent Components in Indium Compound or Cadmium Compound and Concentration of Indium Compound and Cadmium Compound Based on Measured Concentration of Constituent Components>>

The concentration (μg/g) of the constituent components in the indium compound or cadmium compound contained in the mixture according to the present invention is acquired by measuring Cd, Se, In, P, Zn, and the like using ICP-AES (for example, IRIS ADVANTAGE/manufactured by Nippon Jarrell-Ash Co., Ltd) and measuring S and the like using ICP-AES (for example, ICPS-8100, manufactured by Shimadzu Corporation). The concentration of the indium compound or the cadmium compound is acquired from the total amount of each of the above-described constituent components.

<<Measurement of Emission Spectrum>>

The emission spectrum of the mixture according to the present invention is measured with excitation light having a wavelength of 450 nm at room temperature in the atmosphere using an absolute PL quantum yield measuring device (for example, product name: C9920-02, manufactured by Hamamatsu Photonics K. K.).

<Method of Producing Laminated Structure>

The method of producing a laminated structure may be a method (i) of producing a laminated structure, including a step of mixing the perovskite compound (1), the indium compound or cadmium compound (2), the solvent (3), and the polymer (4'), a step of coating a substrate with the obtained mixture, and a step of removing the solvent; a method (ii) of producing a laminated structure, including a step of mixing the perovskite compound (1), the indium compound or cadmium compound (2), and the polymer dissolved in a solvent, a step of coating a substrate with the obtained mixture, and a step of removing the solvent; a method (iii) of producing a laminated structure, including a step of laminating the mixture, which contains the perovskite compound (1), the indium compound or cadmium compound (2), and the polymer (4') and in which the total amount of the perovskite compound (1), the indium compound or cadmium compound (2), and the polymer (4') is 90% by mass or greater with respect to the total mass of the mixture, on a substrate; or a production method (iv) including a step of mixing the perovskite compound (1), the indium compound or cadmium compound (2), and the polymerizable compound, a step of coating a substrate with the obtained mixture, and a step of polymerizing the polymerizable compound.

The mixing step and the step of removing the solvent which are included in the production method (i), the mixing step and the step of removing the solvent which are included in the production method (ii), and the mixing step and the step of polymerizing the polymerizable compound which are included in the production method (iv) can be designed to be the same steps as those included in the above-described method of producing the mixture which contains the compound (1), the compound (2), and the polymer (4') and in which the total amount of the compound (1), the compound (2), and the polymer (4') is 90% by mass with respect to the total mass of the mixture.

Each step of coating a substrate with the mixture, included in the production methods (i), (ii), and (iv) is not particularly limited and can be carried out using a known coating method such as a gravure coating method, a bar coating method, a printing method, a spray method, a spin coating method, a dip method, or a die coating method.

In the step of laminating the mixture on the substrate, included in the production method (iii), an optional adhesive can be used.

The adhesive is not particularly limited as long as the compound (1) and the compound (2) are not dissolved therein, and a known adhesive can be used.

The method of producing a laminated structure may be a production method including a step of further laminating an optional film on the laminated structure obtained by the production methods (i) to (iv).

Examples of the film to be laminated include a reflective film and a diffusion film.

An optional adhesive can be used in the step of laminating the film on the substrate.

The above-described adhesive is not particularly limited as long as the compound (1) and the compound (2) are not dissolved therein, and a known adhesive can be used.

<Method of Producing Light-Emitting Device>

A production method including a step of placing the light source, the mixture on the optical path of a back stage from the light source, or the laminated structure is an exemplary example.

Further, the technical scope of the present invention is not limited to the above-described embodiments, and various modifications can be added within the range not departing from the spirit of the present invention.

EXAMPLES

Hereinafter, the embodiments of the present invention will be described in more detail based on examples and comparative example, but the present invention is not limited to the following examples.

Example 1

0.814 g of cesium carbonate, 40 mL of a solvent containing 1-octadecene, and 2.5 mL of oleic acid were mixed. A cesium carbonate solution was prepared by stirring the solution using a magnetic stirrer and heating the resulting solution at 150° C. for 1 hour while circulating nitrogen.

0.276 g of lead bromide ($PbBr_2$) was mixed into 20 mL of a solvent of 1-octadecene. 2 mL of oleic acid and 2 mL of oleylamine were added to the solution after the solution was stirred using a magnetic stirrer and heated at a temperature of 120° C. for 1 hour while nitrogen was circulated. The solution was heated to a temperature of 160° C., and 1.6 mL of the above-described cesium carbonate solution was added thereto. After the addition, a dispersion liquid was obtained by immersing a reaction container in ice water such that the temperature was decreased to room temperature.

Next, the dispersion liquid was separated by centrifugation at 10000 rpm for 5 minutes to obtain a perovskite compound (P1) as a precipitate.

As the result of measurement performed on the X-ray diffraction pattern of the perovskite compound (P1) using an X-ray diffraction measuring device (XRD, Cu Kα ray, X'pert PRO MPD, manufactured by Spectris plc), it was confirmed that a peak derived from (hkl)=(001) and a three-dimensional perovskite type crystal structure were present at a position where 2θ was 14°.

The average Feret diameter (average particle diameter) of the perovskite compound (P1) measured using a TEM (JEM-2200FS, manufactured by JEOL Ltd.) was 11 nm.

The obtained perovskite compound (P1) was dispersed in 5 mL of toluene, 25 μL of a dispersion liquid was separated, and the compound was re-dispersed in 2.5 mL of toluene to obtain a dispersion liquid containing the perovskite compound (P1).

The concentration of the perovskite compound measured using ICP-MS and ion chromatography was 200 ppm (μg/g).

The emission peak of the emission spectrum measured using an absolute PL quantum yield measuring device (product name: C9920-02, manufactured by Hamamatsu Photonics K. K., excitation light having a wavelength of 450 nm at room temperature in the atmosphere) was at 523 nm.

Next, 0.5 mL of an InP/ZnS dispersion liquid (776785-5ML, manufactured by Sigma-Aldrich Co. LLC) was dispersed in 2 mL of toluene to obtain a dispersion liquid containing an indium compound (I1). The InP/ZnS indicates quantum dots of InP covered with ZnS (here, the same applies hereinafter).

The concentration of InP/ZnS measured using ICP-MS was 110 ppm (μg/g) in terms of InP and 690 ppm (μg/g) in terms of InP/ZnS.

The emission peak of the emission spectrum measured using an absolute PL quantum yield measuring device (product name: C9920-02, manufactured by Hamamatsu Photonics K. K., excitation light having a wavelength of 450 nm at room temperature in the atmosphere) was at 649 nm.

Further, a solution obtained by mixing 0.2 mL of the dispersion liquid containing the perovskite compound and 2.5 mL of the dispersion liquid containing the indium compound was prepared to obtain a mixture having a molar ratio of In/Pb of 29.

The emission spectrum was measured using an absolute PL quantum yield measuring device (product name: C9920-02, manufactured by Hamamatsu Photonics K. K., excitation light having a wavelength of 450 nm at room temperature in the atmosphere). In the emission spectra, two emission peaks were present and these peaks were respectively at 520 nm and 648 nm.

Example 2

A mixture was obtained in the same manner as in Example 1 except that 0.5 mL of the dispersion liquid containing the perovskite compound and 2.5 mL of the dispersion liquid containing the indium compound were mixed and the molar ratio of In/Pb was set to 12.

The emission spectrum was measured using an absolute PL quantum yield measuring device (product name: C9920-02, manufactured by Hamamatsu Photonics K. K., excitation light having a wavelength of 450 nm at room temperature in the atmosphere). In the emission spectra, two emission peaks were present and these peaks were respectively at 520 nm and 648 nm.

Example 3

A mixture was obtained in the same manner as in Example 1 except that 1 mL of the dispersion liquid containing the perovskite compound and 2.5 mL of the dispersion liquid containing the indium compound were mixed and the molar ratio of In/Pb was set to 5.8.

The emission spectrum was measured using an absolute PL quantum yield measuring device (product name: C9920-02, manufactured by Hamamatsu Photonics K. K., excitation light having a wavelength of 450 nm at room temperature in the atmosphere). In the emission spectra, two emission peaks were present and these peaks were respectively at 520 nm and 646 nm.

Example 4

A perovskite compound (P1) was obtained as a precipitate according to the same method as in Example 1.

The obtained perovskite compound (P1) was dispersed in 5 mL of toluene, 50 μL of a dispersion liquid was separated, and the compound was re-dispersed in 5 mL of toluene to obtain a dispersion liquid containing the perovskite compound.

The concentration of the perovskite compound measured using ICP-MS and ion chromatography was 200 ppm (μg/g).

The emission spectrum was measured using an absolute PL quantum yield measuring device (product name: C9920-02, manufactured by Hamamatsu Photonics K. K., excitation light having a wavelength of 450 nm at room temperature in the atmosphere). The emission peak was at 523 nm.

Next, an InP/ZnS dispersion liquid (776785-5ML, manufactured by Sigma-Aldrich Co. LLC) was prepared and used as a dispersion liquid containing an indium compound (I1). The concentration of InP/ZnS measured using ICP-MS was 540 ppm (μg/g) in terms of InP and 3400 ppm (μg/g) in terms of InP/ZnS.

The emission spectrum was measured using an absolute PL quantum yield measuring device (product name: C9920-02, manufactured by Hamamatsu Photonics K. K., excitation light having a wavelength of 450 nm at room temperature in the atmosphere). The emission peak was at 649 nm.

Further, a solution obtained by mixing 5 mL of the dispersion liquid containing the perovskite compound and 10 μL of the dispersion liquid containing the indium compound was prepared to obtain a mixture having a molar ratio of In/Pb of 0.023.

The emission spectrum was measured using an absolute PL quantum yield measuring device (product name: C9920-02, manufactured by Hamamatsu Photonics K. K., excitation light having a wavelength of 450 nm at room temperature in the atmosphere). In the emission spectra, two emission peaks were present and these peaks were respectively at 523 nm and 642 nm.

Example 5

A mixture was obtained in the same manner as in Example 4 except that 5 mL of the dispersion liquid containing the perovskite compound and 30 μL of the dispersion liquid containing the indium compound were mixed and the molar ratio of In/Pb was set to 0.070.

The emission spectrum was measured using an absolute PL quantum yield measuring device (product name: C9920-02, manufactured by Hamamatsu Photonics K. K., excitation light having a wavelength of 450 nm at room temperature in the atmosphere). In the emission spectra, two emission peaks were present and these peaks were respectively at 523 nm and 643 nm.

Example 6

0.814 g of cesium carbonate, 40 mL of a solvent containing 1-octadecene, and 2.5 mL of oleic acid were mixed. A cesium carbonate solution was prepared by stirring the solution using a magnetic stirrer and heating the resulting solution at 150° C. for 1 hour while circulating nitrogen.

0.110 g of lead bromide ($PbBr_2$) and 0.208 g of lead iodide ($PbI_2$) were mixed into 20 mL of a solvent of 1-octadecene. 2 mL of oleic acid and 2 mL of oleylamine were added to the solution after the solution was stirred using a magnetic stirrer and heated at a temperature of 120° C. for 1 hour while nitrogen was circulated.

The solution was heated to a temperature of 160° C., and 1.6 mL of the above-described cesium carbonate solution was added thereto. After the addition, a dispersion liquid was obtained by immersing a reaction container in ice water such that the temperature was decreased to room temperature.

Next, the dispersion liquid was separated by centrifugation at 10000 rpm for 5 minutes to obtain a perovskite compound (P2) as a precipitate.

As the result of measurement performed on the X-ray diffraction pattern of the perovskite compound (P2) using an X-ray diffraction measuring device (XRD, Cu Kα ray, X'pert PRO MPD, manufactured by Spectris plc), it was confirmed that a peak derived from (hkl)=(001) and a three-dimensional perovskite type crystal structure were present at a position where 2θ was 14°.

The average Feret diameter (average particle diameter) of the perovskite compound (P2) measured using a TEM (JEM-2200FS, manufactured by JEOL Ltd.) was 19 nm.

The perovskite compound (P2) was dispersed in 5 mL of toluene, 25 µL of a dispersion liquid was separated, and the compound was re-dispersed in 2.5 mL of toluene to obtain a dispersion liquid containing the perovskite compound (P2).

The concentration of the perovskite compound measured using ICP-MS and ion chromatography was 200 ppm (µg/g).

The emission peak of the emission spectrum measured using an absolute PL quantum yield measuring device (product name: C9920-02, manufactured by Hamamatsu Photonics K. K., excitation light having a wavelength of 450 nm at room temperature in the atmosphere) was at 638 nm.

Next, 0.5 mL of an InP/ZnS dispersion liquid (776750-5ML, manufactured by Sigma-Aldrich Co. LLC) was dispersed in 2 mL of toluene to obtain a dispersion liquid containing an indium compound (I2).

The concentration of the perovskite compound measured using ICP-MS was 140 ppm (µg/g) in terms of InP and 840 ppm (µg/g) in terms of InP/ZnS.

The emission spectrum was measured using an absolute PL quantum yield measuring device (product name: C9920-02, manufactured by Hamamatsu Photonics K. K., excitation light having a wavelength of 450 nm at room temperature in the atmosphere). The emission peak was at 530 nm.

Further, a solution obtained by mixing 0.2 mL of the dispersion liquid containing the perovskite compound and 2.5 mL of the dispersion liquid containing the indium compound was prepared to obtain a mixture having a molar ratio of In/Pb of 66.

The emission spectrum was measured using an absolute PL quantum yield measuring device (product name: C9920-02, manufactured by Hamamatsu Photonics K. K., excitation light having a wavelength of 450 nm at room temperature in the atmosphere). In the emission spectra, two emission peaks were present and these peaks were respectively at 529 nm and 635 nm.

Example 7

A mixture was obtained in the same manner as in Example 6 except that 0.5 mL of the dispersion liquid containing the perovskite compound and 2.5 mL of the dispersion liquid containing the indium compound were mixed and the molar ratio of In/Pb was set to 26.

The emission spectrum was measured using an absolute PL quantum yield measuring device (product name: C9920-02, manufactured by Hamamatsu Photonics K. K., excitation light having a wavelength of 450 nm at room temperature in the atmosphere). In the emission spectra, two emission peaks were present and these peaks were respectively at 529 nm and 632 nm.

Example 8

A dispersion liquid containing the perovskite compound (P1) and a dispersion liquid containing the indium compound (I1) were obtained according to the same method as in Example 1.

Next, a methacrylic resin (PMMA, manufactured by Sumitomo Chemical Co., Ltd., SUMIPEX methacrylic resin, MH, molecular weight of approximately 120000, specific gravity of 1.2 g/ml) was mixed with toluene such that the amount of thereof reached 16.5% by mass, and the solution was heated at 60° C. for 3 hours to obtain a solution in which the polymer was dissolved.

Further, 0.913 g of the solution in which the polymer was dissolved, 2.5 mL of the dispersion liquid containing the perovskite compound, and 1 mL of the dispersion liquid containing the indium compound were mixed such that the molar ratio of In/Pb was set to 5.8.

A mixture in which the perovskite compound and the indium compound were dispersed in the resin was obtained by naturally drying the solvent to be evaporated. The mixture was cut into a size of 1 cm×1 cm.

The emission spectrum was measured using an absolute PL quantum yield measuring device (product name: C9920-02, manufactured by Hamamatsu Photonics K. K., excitation light having a wavelength of 450 nm at room temperature in the atmosphere). In the emission spectra, two emission peaks were present and these peaks were respectively at 523 nm and 650 nm.

Example 9

A dispersion liquid containing the perovskite compound (P2) and a dispersion liquid containing the indium compound (I2) were obtained according to the same method as in Example 6.

Next, a methacrylic resin (PMMA, manufactured by Sumitomo Chemical Co., Ltd., SUMIPEX methacrylic resin, MH, molecular weight of approximately 120000, specific gravity of 1.2 g/ml) was mixed with toluene such that the amount of thereof reached 16.5% by mass, and the solution was heated at 60° C. for 3 hours to obtain a solution in which the polymer was dissolved.

Further, 0.913 g of the solution in which the polymer was dissolved, 0.5 mL of the dispersion liquid containing the perovskite compound, and 2.5 mL of the dispersion liquid containing the indium compound were mixed such that the molar ratio of In/Pb was set to 26.

A mixture in which the perovskite compound and the indium compound were dispersed in the resin was obtained by naturally drying the solvent to be evaporated. The mixture was cut into a size of 1 cm×1 cm.

The emission spectrum was measured using an absolute PL quantum yield measuring device (product name: C9920-02, manufactured by Hamamatsu Photonics K. K., excitation light having a wavelength of 450 nm at room temperature in the atmosphere). In the emission spectra, two emission peaks were present and these peaks were respectively at 531 nm and 641 nm.

Example 10

A perovskite compound (P1) was obtained as a precipitate according to the same method as in Example 1.

The obtained perovskite compound (P1) was dispersed in 5 mL of toluene, 50 µL of a dispersion liquid was separated, and the compound was re-dispersed in 5 mL of toluene to obtain a dispersion liquid containing the perovskite compound.

The concentration of the perovskite compound measured using ICP-MS and ion chromatography was 200 ppm (µg/g).

The emission spectrum was measured using an absolute PL quantum yield measuring device (product name: C9920-02, manufactured by Hamamatsu Photonics K. K., excitation light having a wavelength of 450 nm at room temperature in the atmosphere). The emission peak was at 523 nm.

Next, CdSe/ZnS (790206-25MG, manufactured by Sigma-Aldrich Co. LLC) was prepared and dispersed in toluene so as to be used as a dispersion liquid containing a cadmium compound (C1).

The concentration of CdSe/ZnS measured using ICP-AES was 680 ppm (μg/g) in terms of CdSe and 880 ppm (μg/g) in terms of CdSe/ZnS.

The emission spectrum was measured using an absolute PL quantum yield measuring device (product name: C9920-02, manufactured by Hamamatsu Photonics K. K., excitation light having a wavelength of 450 nm at room temperature in the atmosphere). The emission peak was at 630 nm.

Next, a methacrylic resin (PMMA, manufactured by Sumitomo Chemical Co., Ltd., SUMIPEX methacrylic resin, MH, molecular weight of approximately 120000, specific gravity of 1.2 g/ml) was mixed with toluene such that the amount of thereof reached 16.5% by mass, and the solution was heated at 60° C. for 3 hours to obtain a solution in which the polymer was dissolved.

Further, 0.913 g of the solution in which the polymer was dissolved, 1.5 mL of the dispersion liquid containing the perovskite compound, and 1.5 mL of the dispersion liquid containing the cadmium compound were mixed such that the molar ratio of Cd/Pb was set to 3.9.

A mixture in which the perovskite compound and the cadmium compound were dispersed in the resin was obtained by naturally drying the solvent to be evaporated. The mixture was cut into a size of 1 cm×1 cm.

The emission spectrum was measured using an absolute PL quantum yield measuring device (product name: C9920-02, manufactured by Hamamatsu Photonics K. K., excitation light having a wavelength of 450 nm at room temperature in the atmosphere).

In the emission spectra, two emission peaks were present and these peaks were respectively at 517 nm and 631 nm.

Example 11

A perovskite compound (P2) was obtained as a precipitate according to the same method as in Example 6.

The obtained perovskite compound (P2) was dispersed in 5 mL of toluene, 50 μL of a dispersion liquid was separated, and the compound was re-dispersed in 5 mL of toluene to obtain a dispersion liquid containing the perovskite compound.

The concentration of the perovskite compound measured using ICP-MS and ion chromatography was 200 ppm (μg/g).

The emission spectrum was measured using an absolute PL quantum yield measuring device (product name: C9920-02, manufactured by Hamamatsu Photonics K. K., excitation light having a wavelength of 450 nm at room temperature in the atmosphere). The emission peak was at 638 nm.

Next, CdSe/ZnS (748056-25MG, manufactured by Sigma-Aldrich Co. LLC) was prepared and dispersed in toluene so as to be used as a dispersion liquid containing a cadmium compound (C2).

The concentration of CdSe/ZnS measured using ICP-AES was 440 ppm (μg/g) in terms of CdSe and 870 ppm (μg/g) in terms of CdSe/ZnS.

The emission spectrum was measured using an absolute PL quantum yield measuring device (product name: C9920-02, manufactured by Hamamatsu Photonics K. K., excitation light having a wavelength of 450 nm at room temperature in the atmosphere). The emission peak was at 566 nm.

Next, a methacrylic resin (PMMA, manufactured by Sumitomo Chemical Co., Ltd., SUMIPEX methacrylic resin, MH, molecular weight of approximately 120000, specific gravity of 1.2 g/ml) was mixed with toluene such that the amount of thereof reached 16.5% by mass, and the solution was heated at 60° C. for 3 hours to obtain a solution in which the polymer was dissolved.

Further, 0.913 g of the solution in which the polymer was dissolved, 1.5 mL of the dispersion liquid containing the perovskite compound, and 1.5 mL of the dispersion liquid containing the cadmium compound were mixed such that the molar ratio of Cd/Pb was set to 3.1.

A mixture in which the perovskite compound the indium compound were dispersed in the resin was obtained by naturally drying the solvent to be evaporated. The mixture was cut into a size of 1 cm×1 cm.

The emission spectrum was measured using an absolute PL quantum yield measuring device (product name: C9920-02, manufactured by Hamamatsu Photonics K. K., excitation light having a wavelength of 450 nm at room temperature in the atmosphere). In the emission spectra, two emission peaks were present and these peaks were respectively at 564 nm and 630 nm.

Example 12

A dispersion liquid containing the perovskite compound (P1) and a dispersion liquid containing the indium compound (I1) were obtained according to the same method as in Example 1.

Next, a solution in which a cycloolefin polymer resin (hereinafter, also referred to as COP) was dissolved in cyclohexane such that the amount of thereof reached 20% by mass was prepared.

Further, 0.75 g of the solution in which the polymer was dissolved, 2.5 mL of the dispersion liquid containing the perovskite compound, and 2.5 mL of the dispersion liquid containing the indium compound were mixed such that the molar ratio of In/Pb was set to 2.3.

A mixture in which the perovskite compound and the indium compound were dispersed in the resin was obtained by naturally drying the solvent to be evaporated. The mixture was cut into a size of 100 μm×1 cm×1 cm.

The emission spectrum was measured using an absolute PL quantum yield measuring device (product name: C9920-02, manufactured by Hamamatsu Photonics K. K., excitation light having a wavelength of 450 nm at room temperature in the atmosphere). In the emission spectra, two emission peaks were present and these peaks were respectively at 517 nm and 648 nm.

Example 13

A dispersion liquid containing the perovskite compound (P1) and a dispersion liquid containing the indium compound (I1) were obtained according to the same method as in Example 1.

Next, a solution in which COP was dissolved in cyclohexane such that the amount of thereof reached 20% by mass was prepared.

Further, 0.75 g of the solution in which the polymer was dissolved, 2.5 mL of the dispersion liquid containing the perovskite compound, and 5 mL of the dispersion liquid containing the indium compound were mixed such that the molar ratio of In/Pb was set to 4.6.

A mixture in which the perovskite compound and the indium compound were dispersed in the resin was obtained by naturally drying the solvent to be evaporated. The mixture was cut into a size of 100 μm×1 cm×1 cm.

The emission spectrum was measured using an absolute PL quantum yield measuring device (product name: C9920-02, manufactured by Hamamatsu Photonics K. K., excitation light having a wavelength of 450 nm at room temperature in the atmosphere). In the emission spectra, two emission peaks were present and these peaks were respectively at 517 nm and 668 nm.

Example 14

A dispersion liquid containing the perovskite compound (P1) and a dispersion liquid containing the indium compound (I1) were obtained according to the same method as in Example 1.

Next, a solution in which a silicone resin was dissolved was prepared (KR255, manufactured by Shin-Etsu Chemical Co., Ltd., toluene solvent, 50 wt %).
Further, 0.3 g of the solution in which the polymer was dissolved, 2.5 mL of the dispersion liquid containing the perovskite compound, and 2.5 mL of the dispersion liquid containing the indium compound were mixed such that the molar ratio of In/Pb was set to 2.3.

A mixture in which the perovskite compound and the indium compound were dispersed in the resin was obtained by naturally drying the solvent to be evaporated. The mixture was cut into a size of 100 μm×1 cm×1 cm.

The emission spectrum was measured using an absolute PL quantum yield measuring device (product name: C9920-02, manufactured by Hamamatsu Photonics K. K., excitation light having a wavelength of 450 nm at room temperature in the atmosphere). In the emission spectra, two emission peaks were present and these peaks were respectively at 517 nm and 651 nm.

Example 15

A dispersion liquid containing the perovskite compound (P1) and a dispersion liquid containing the indium compound (I1) were obtained according to the same method as in Example 1.

Next, a solution in which a silicone resin was dissolved was prepared (KR255, manufactured by Shin-Etsu Chemical Co., Ltd., toluene solvent, 50 wt %).
Further, 0.3 g of the solution in which the polymer was dissolved, 2.5 mL of the dispersion liquid containing the perovskite compound, and 5 mL of the dispersion liquid containing the indium compound were mixed such that the molar ratio of In/Pb was set to 4.6.

A mixture in which the perovskite compound and the indium compound were dispersed in the resin was obtained by naturally drying the solvent to be evaporated. The mixture was cut into a size of 100 μm×1 cm×1 cm.

The emission spectrum was measured using an absolute PL quantum yield measuring device (product name: C9920-02, manufactured by Hamamatsu Photonics K. K., excitation light having a wavelength of 450 nm at room temperature in the atmosphere). In the emission spectra, two emission peaks were present and these peaks were respectively at 517 nm and 662 nm.

Comparative Example 1

A dispersion liquid containing the perovskite compound (P1) was obtained according to the same method as in Example 1.

A dispersion liquid containing the perovskite compound (P2) was obtained according to the same method as in Example 4.

Next, a solution obtained by mixing 2.5 mL of the dispersion liquid containing the perovskite compound (P1) with 0.2 mL of the dispersion liquid containing the perovskite compound (P2) was prepared.

The emission spectrum was measured using an absolute PL quantum yield measuring device (product name: C9920-02, manufactured by Hamamatsu Photonics K. K., excitation light having a wavelength of 450 nm at room temperature in the atmosphere). One emission peak was present and the peak was at 529 nm.

Comparative Example 2

A mixture was obtained according to the same method as in Comparative Example 1 except that 2.5 mL of the dispersion liquid containing the perovskite compound (P1) and 0.5 mL of the dispersion liquid containing the perovskite compound (P2) were mixed.

The emission spectrum was measured using an absolute PL quantum yield measuring device (product name: C9920-02, manufactured by Hamamatsu Photonics K. K., excitation light having a wavelength of 450 nm at room temperature in the atmosphere). One emission peak was present and the peak was at 530 nm.

Comparative Example 3

A mixture was obtained according to the same method as in Comparative Example 1 except that 1.5 mL of the dispersion liquid containing the perovskite compound (P1) and 1.5 mL of the dispersion liquid containing the perovskite compound (P2) were mixed.

The emission spectrum was measured using an absolute PL quantum yield measuring device (product name: C9920-02, manufactured by Hamamatsu Photonics K. K., excitation light having a wavelength of 450 nm at room temperature in the atmosphere). One emission peak was present and the peak was at 570 nm.

Comparative Example 4

A mixture was obtained according to the same method as in Comparative Example 1 except that 1.0 mL of the dispersion liquid containing the perovskite compound (P1) and 2.5 mL of the dispersion liquid containing the perovskite compound (P2) were mixed.

The emission spectrum was measured using an absolute PL quantum yield measuring device (product name: C9920-02, manufactured by Hamamatsu Photonics K. K., excitation light having a wavelength of 450 nm at room temperature in the atmosphere). One emission peak was present and the peak was at 582 nm.

Comparative Example 5

A mixture was obtained according to the same method as in Comparative Example 1 except that 0.5 mL of the dispersion liquid containing the perovskite compound (P1) and 2.5 mL of the dispersion liquid containing the perovskite compound (P2) were mixed.

The emission spectrum was measured using an absolute PL quantum yield measuring device (product name: C9920-02, manufactured by Hamamatsu Photonics K. K., excitation light having a wavelength of 450 nm at room temperature in the atmosphere). One emission peak was present and the peak was at 603 nm.

Comparative Example 6

A mixture was obtained according to the same method as in Comparative Example 1 except that 0.2 mL of the dispersion liquid containing the perovskite compound (P1) and 2.5 mL of the dispersion liquid containing the perovskite compound (P2) were mixed.

The emission spectrum was measured using an absolute PL quantum yield measuring device (product name: C9920-02, manufactured by Hamamatsu Photonics K. K., excitation light having a wavelength of 450 nm at room temperature in the atmosphere). One emission peak was present and the peak was at 637 nm.

(Measurement of Concentration of Perovskite Compound)

The concentration of the perovskite compound in the dispersion liquid or in mixture obtained in each example and each comparative example was obtained by adding N,N-dimethylformamide to the dispersion liquid containing the solvent and the perovskite compound which was obtained by re-dispersion, dissolving the perovskite compound therein, and measuring the concentration using ICP-MS (ELAN DRCII, manufactured by PerkinElmer, Inc.) and ion chromatography.

(Measurement of Concentration of Indium Compound)

The concentration of the indium compound in the dispersion liquid or in mixture obtained in each example was obtained by measuring the indium compound obtained by re-dispersion using ICP-AES (IRIS ADVANTAGE/manufactured by Nippon Jarrell-Ash Co., Ltd., ICPS-8100/manufactured by Shimadzu Corporation).

(Measurement of Concentration of Cadmium Compound)

The concentration of the cadmium compound in the dispersion liquid or mixture obtained in each example was obtained by measuring the cadmium compound obtained by re-dispersion using ICP-AES (IRIS ADVANTAGE/manufactured by Nippon Jarrell-Ash Co., Ltd., ICPS-8100/manufactured by Shimadzu Corporation).

(Measurement of Emission Spectrum)

The emission spectra of the mixtures obtained in Examples 1 to 15 and Comparative Examples 1 to 6 were measured using an absolute PL quantum yield measuring device (product name: C9920-02, manufactured by Hamamatsu Photonics K. K., excitation light having a wavelength of 450 at room temperature in the atmosphere).

The configurations of the mixtures obtained in Examples 1 to 9 and Comparative Examples 1 to 6 and the emission peaks (nm) are listed in Table 1 shown below. In Table 1, "indium/Pb" indicates the molar ratio obtained by dividing the amount of the indium element by the amount of the Pb ion (the component B in the perovskite compound).

Figure 3:
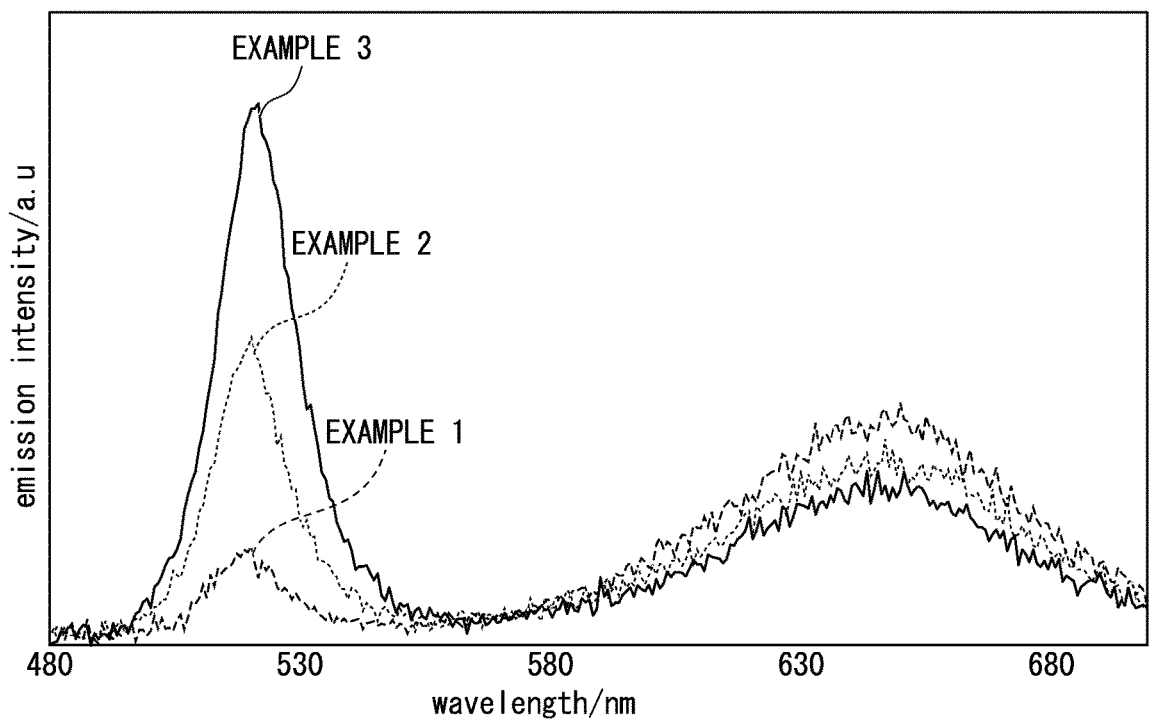
FIG. 3 is a graph showing results of emission spectra of mixtures obtained in Examples 1 to 3.
Figure 4:
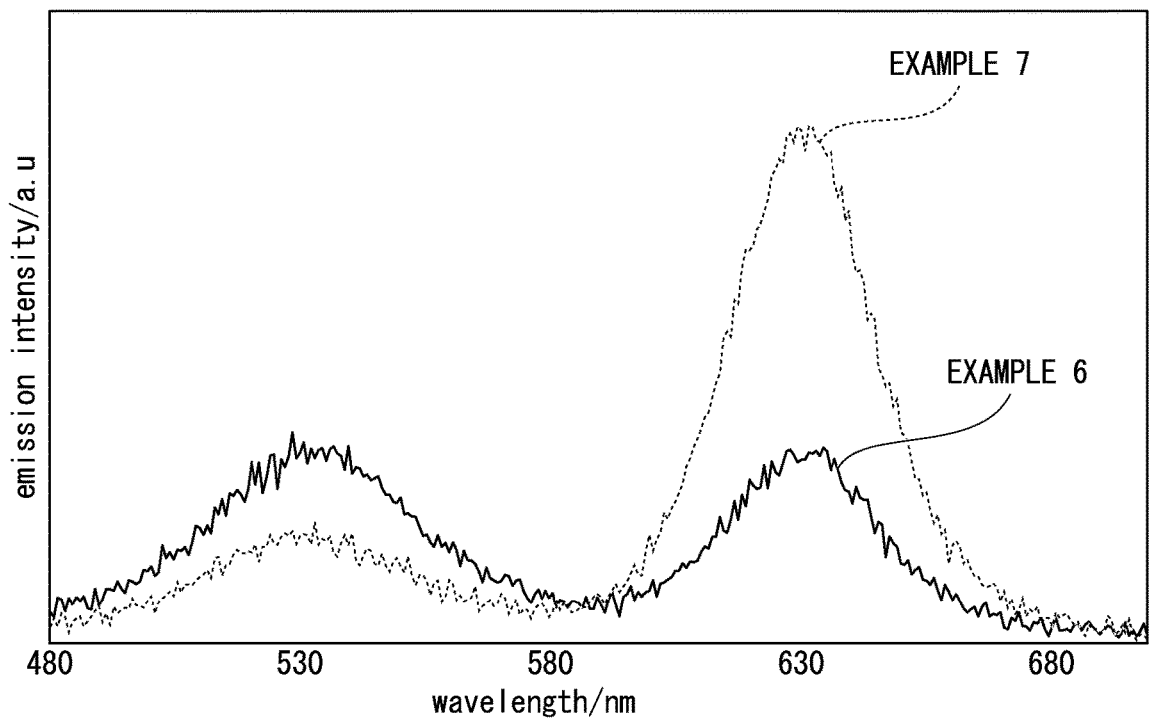
FIG. 4 is a graph showing results of emission spectra of mixtures obtained in Examples 6 and 7.
Figure 5:
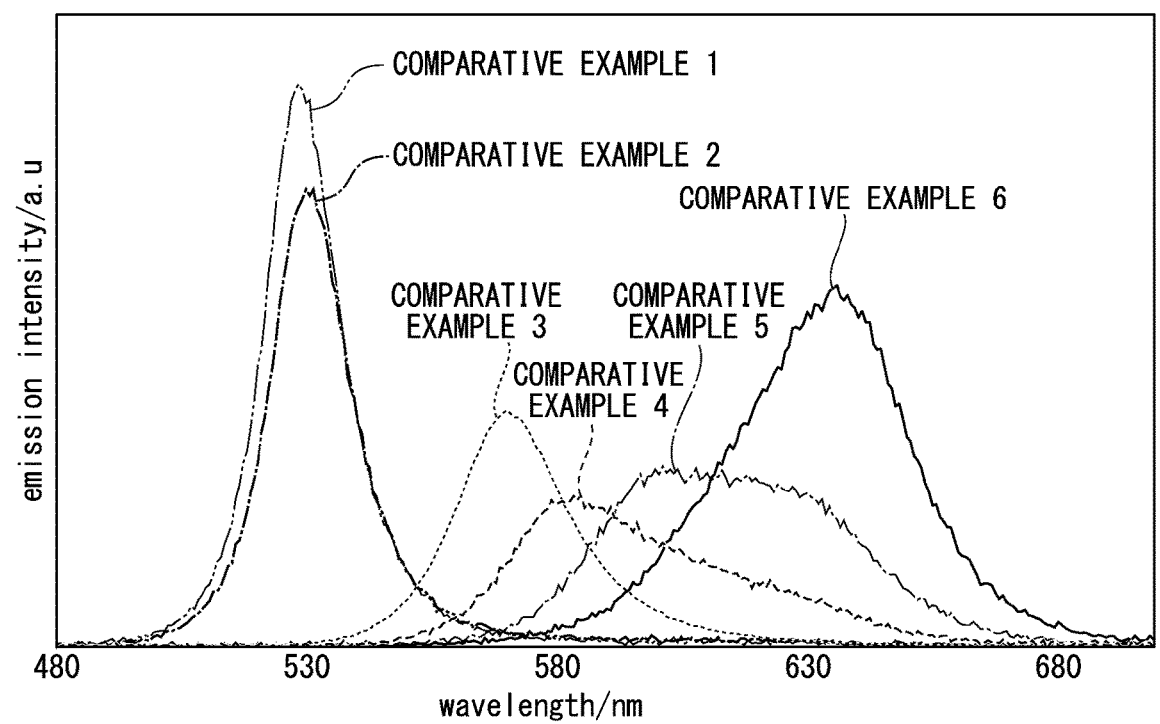
FIG. 5 is a graph showing results of emission spectra of mixtures obtained in Comparative Examples 1 to 6.

The results from Examples 1 to 3 are shown in FIG. 3, the results from Examples 6 and 7 are shown in FIG. 4, and the results from Comparative Examples 1 to 6 are shown in FIG. 5.

TABLE 1

|  | Compound 1 | Compound 2 | Polymerizable compound or polymer | Indium/Pb | Emission peak 1 (nm) | Emission peak 2 (nm) |
| --- | --- | --- | --- | --- | --- | --- |
| Example 1 | Perovskite compound (P1) | Indium compound (I1) | — | 29 | 520 | 648 |
| Example 2 | Perovskite compound (P1) | Indium compound (I1) | — | 12 | 520 | 648 |
| Example 3 | Perovskite compound (P1) | Indium compound (I1) | — | 5.8 | 520 | 646 |
| Example 4 | Perovskite compound (P1) | Indium compound (I1) | — | 0.023 | 523 | 642 |
| Example 5 | Perovskite compound (P1) | Indium compound (I1) | — | 0.070 | 523 | 643 |
| Example 6 | Perovskite compound (P2) | Indium compound (I2) | — | 66 | 529 | 635 |
| Example 7 | Perovskite compound (P2) | Indium compound (I2) | — | 26 | 529 | 632 |
| Example 8 | Perovskite compound (P1) | Indium compound (I1) | PMMA | 5.8 | 523 | 650 |
| Example 9 | Perovskite compound (P2) | Indium compound (I2) | PMMA | 26 | 531 | 641 |
| Comparative Example 1 | Perovskite compound (P1) | Perovskite compound (P2) | — | — | 529 | — |
| Comparative Example 2 | Perovskite compound (P1) | Perovskite compound (P2) | — | — | 530 | — |
| Comparative Example 3 | Perovskite compound (P1) | Perovskite compound (P2) | — | — | 570 | — |
| Comparative Example 4 | Perovskite compound (P1) | Perovskite compound (P2) | — | — | 582 | — |
| Comparative Example 5 | Perovskite compound (P1) | Perovskite compound (P2) | — | — | 603 | — |
| Comparative Example 6 | Perovskite compound (P1) | Perovskite compound (P2) | — | — | 637 | — |

The configurations of the mixtures obtained in Examples 10 and 11 and the emission peaks (nm) are listed in Table 2 shown below. In Table 2, "cadmium/Pb" indicates the molar ratio obtained by dividing the amount of the cadmium element by the amount of the Pb ion (the component B in the perovskite compound).

TABLE 2

| | Compound 1 | Compound 2 | Polymerizable compound or polymer | Cadmium/Pb | Emission peak 1 (nm) | Emission peak 2 (nm) |
|---|---|---|---|---|---|---|
| Example 10 | Perovskite compound (P1) | Cadmium compound (C1) | PMMA | 3.9 | 517 | 631 |
| Example 11 | Perovskite compound (P2) | Cadmium compound (C2) | PMMA | 3.1 | 564 | 630 |

The configurations of the mixtures obtained in Examples 12 to 15 and the emission peaks (nm) are listed in Table 3 shown below. In Table 3, "indium/Pb" indicates the molar ratio obtained by dividing the amount of the indium element by the amount of the Pb ion (the component B in the perovskite compound).

TABLE 3

| | Compound 1 | Compound 2 | Polymerizable compound or polymer | Indium/Pb | Emission peak 1 (nm) | Emission peak 2 (nm) |
|---|---|---|---|---|---|---|
| Example 12 | Perovskite compound (P1) | Indium compound (I1) | COP | 2.3 | 517 | 648 |
| Example 13 | Perovskite compound (P1) | Indium compound (I1) | COP | 4.6 | 517 | 668 |
| Example 14 | Perovskite compound (P1) | Indium compound (I1) | Silicone | 2.3 | 517 | 651 |
| Example 15 | Perovskite compound (P1) | Indium compound (I1) | Silicone | 4.6 | 517 | 662 |

Based on the results described above, it was confirmed that the mixtures according to Examples 1 to 15 to which the present invention was applied each had two emission peaks compared to the mixtures of Comparative Examples 1 to 6 to which the present invention was not applied.

Reference Example 1

A backlight that is capable of converting blue light of a blue light-emitting diode to green light or red light by putting each mixture of Examples 8 to 15 into a glass tube or the like so as to be sealed and disposing the glass tube or the like between a light-guiding plate and the blue light-emitting diode serving as a light source is produced.

Reference Example 2

A backlight that is capable of converting blue light to be applied to a sheet after passing through a light-guiding plate from a blue light-emitting diode placed on an end surface (side surface) of the light-guiding plate to green light or red light by forming the sheet using each mixture of Examples 8 to 15 and placing a film obtained by interposing the sheet between two barrier films so as to be sealed on the light-guiding plate is produced.

Reference Example 3

A backlight that is capable of converting blue light to be applied to green light or red light by placing each mixture of Examples 8 to 15 in the vicinity of a light-emitting unit of a blue light-emitting diode is produced.

Reference Example 4

A wavelength conversion material can be obtained by mixing each mixture of Examples 1 to 7 with a resist and removing the solvent. A backlight that is capable of converting blue light from a light source to green light or red light by disposing the obtained wavelength conversion material between the blue light-emitting diode serving as a light source and a light-guiding plate and on a back stage of an OLED serving as a light source is produced.

Reference Example 5

An LED is obtained by mixing each mixture of Examples 1 to 7 with conductive particles such as ZnS to form a film, laminating an n-type transport layer on one surface of the film, and laminating a p-type transport layer on the other surface thereof. The LED is allowed to emit light by circulating the current so that positive holes of the p-type semiconductor and electrons of the n-type semiconductor cancelled the charge in the semiconductor fine particles of the bonding surface.

Reference Example 6

A solar cell is prepared by laminating a titanium oxide dense layer on a surface of a fluorine-doped tin oxide (FTO) substrate, laminating a porous aluminum oxide layer thereon, laminating each mixture of Examples 1 to 15 thereon, laminating a hole transport layer such as 2,2',7,7'-tetrakis-(N,N'-di-p-methoxyphenylamine)-9,9'-spirobifluorene (Spiro-OMeTAD) thereon after the solvent is removed as necessary, and laminating a silver (Ag) layer thereon.

Reference Example 7

A laser diode illumination emitting white light by converting blue light applied from a blue light-emitting diode to a resin molded body to green light or red light is produced by mixing each mixture of Examples 1 to 7 with a resin, removing the solvent for molding to obtain the resin mixture containing the mixture according to the present invention, and placing the resin mixture on a back stage of the blue light-emitting diode.

Reference Example 8

A laser diode illumination emitting white light by converting blue light applied from a blue light-emitting diode to a resin molded body to green light or red light is produced by placing each mixture of Examples 8 to 15 on a back stage of the blue light-emitting diode.

INDUSTRIAL APPLICABILITY

According to the present invention, it is possible to provide a mixture containing a perovskite compound having two kinds of emission peaks and high productivity, a film formed of the mixture, a laminated structure containing the mixture, and a display obtained by using the mixture.

Therefore, the mixture of the present invention, the film formed of the mixture, the laminated structure containing the mixture, and the display obtained by using the mixture can be suitably used for light emission.

REFERENCE SIGNS LIST

1a: first laminated structure
1b: second laminated structure
10: film
20: first substrate
21: second substrate
22: sealing layer
2: light-emitting device
3: display
30: light source
40: liquid crystal panel
50: prism sheet
60: light-guiding plate

What is claimed is:

1. A mixture comprising:
(i) a light-emitting perovskite compound comprising a metal ion, a monovalent cation positioned at each vertex of a hexahedron having the metal ion at the center in a perovskite type crystal structure, one or more kinds of anions selected from the group consisting of a halide ion and a thiocyanate ion, the anion being positioned at each vertex of an octahedron having the metal ion at the center in the perovskite type crystal structure;
(ii) a light-emitting indium compound or light-emitting cadmium compound; and
(iii) at least one compound selected from the group consisting of ammonia, an amine, a carboxylic acid, and salts or ions thereof; and
(iv) polymethyl methacrylate (PMMA).

2. The mixture according to claim 1, wherein a total content ratio of the light-emitting perovskite compound, the light-emitting indium compound or light-emitting cadmium compound, and the PMMA is 90% by mass or greater with respect to a total mass of the mixture.

3. The mixture according to claim 1, wherein the mixture comprises the light-emitting indium compound.

4. The mixture according to claim 1, further comprising: at least one solvent selected from the group consisting of ester, ketone, ether, alcohol, glycol ether, an organic solvent containing an amide group, an organic solvent containing a nitrile group, an organic solvent containing a halogenated hydrocarbon group, and an organic solvent containing a hydrocarbon group.

5. The mixture according to claim 1, wherein the average particle diameter of the perovskite compound is from 1 nm to 500 nm.

6. The mixture according to claim 1, wherein the median diameter (D50) of the perovskite compound is from 2 nm to 5 μm.

7. The mixture according to claim 1, wherein the monovalent cation comprises at least one ion selected from the group consisting of a cesium ion, an organic ammonium ion, and an amidinium ion.

8. The mixture according to claim 1, wherein the anions comprise the halide ion.

9. The mixture according to claim 1, wherein the metal ion comprises lead or tin.

10. A film which is formed of the mixture according to claim 2.

11. A laminated structure comprising: the film according to claim 10.

12. A light-emitting device comprising: the laminated structure according to claim 11.

13. A display comprising: the laminated structure according to claim 11.

* * * * *